(12) United States Patent
Nakagawa

(10) Patent No.: US 7,658,860 B2
(45) Date of Patent: Feb. 9, 2010

(54) METAL PATTERN AND PROCESS FOR PRODUCING THE SAME

(75) Inventor: Tohru Nakagawa, Kusatsu (JP)

(73) Assignee: Panasonic Corporation, Osaka (JP)

( * ) Notice: Subject to any disclaimer, the term of this patent is extended or adjusted under 35 U.S.C. 154(b) by 949 days.

(21) Appl. No.: 10/568,158

(22) PCT Filed: Jan. 13, 2005

(86) PCT No.: PCT/JP2005/000267

§ 371 (c)(1),
(2), (4) Date: Feb. 13, 2006

(87) PCT Pub. No.: WO2005/069705

PCT Pub. Date: Jul. 28, 2005

(65) Prior Publication Data

US 2009/0139421 A1 Jun. 4, 2009

(30) Foreign Application Priority Data

Jan. 15, 2004 (JP) .............................. 2004-008508

(51) Int. Cl.
*C03C 15/00* (2006.01)
*C03C 25/68* (2006.01)
*C25F 3/00* (2006.01)

(52) U.S. Cl. ...................... 216/100; 101/465; 438/681; 438/156; 438/784; 438/283; 438/637; 438/447

(58) Field of Classification Search .................. 216/100; 101/465; 438/681, 156, 784, 283, 637, 447
See application file for complete search history.

(56) References Cited

U.S. PATENT DOCUMENTS

2002/0151161 A1  10/2002  Furusawa

2004/0200575 A1  10/2004  Bietsch et al.

FOREIGN PATENT DOCUMENTS

JP   10-204350   8/1998
JP   11-174683   7/1999

(Continued)

OTHER PUBLICATIONS

W.H. Loh et al., "All-solid state subpicosecond passively mode locked erbium-doped fiber laser" Appl. Phys. Lett. vol. 63 (1), American Institute of Physics, 1993, pp. 4-6.
J.A. Rogers et al., "Printing, molding, and near-field photolithographic methods for patterning organic lasers, smart pixels and simple circuits", Synthetic Metals, vol. 115, 2000, pp. 5-11.

*Primary Examiner*—Nadine G Norton
*Assistant Examiner*—Mahmoud Dahimene
(74) *Attorney, Agent, or Firm*—Hamre, Schumann, Mueller & Larson, P.C.

(57) ABSTRACT

A metal pattern of the present invention is a metal pattern (13') formed on a surface of a substrate by etching, and a monomolecular film containing fluorinated alkyl chains $(CF_3(CF_2)_n-$, where n represents an integer) is formed on a surface of a metal film composing the metal pattern (13'), and a masking film (18) is formed by penetration of a molecule having a mercapto group (—SH) or a disulfide (—SS—) group into interstices between molecules composing the monomolecular film. The metal pattern is produced by: forming a monomolecular film containing fluorinated alkyl chains $(CF_3(CF_2)_n-$, where n represents an integer) on a surface of a metal film; forming a masking film by applying a solution in which a molecule having a mercapto group (—SH) or a disulfide (—SS—) group is dissolved over a surface of the monomolecular film so that the molecule having a mercapto group (—SH) or a disulfide (—SS—) group penetrates in interstices between molecules composing the monomolecular film; and etching the metal film by exposing the surface of the metal film to an etching solution so that a portion of the metal film in a region not covered with the masking film is removed.

20 Claims, 13 Drawing Sheets

FOREIGN PATENT DOCUMENTS

| | | |
|---|---|---|
| JP | 2000-282240 | 10/2000 |
| JP | 2000-340928 | 12/2000 |
| JP | 3245410 | 10/2001 |
| JP | 2002-13487 | 1/2002 |
| JP | 2002-294469 A | 10/2002 |
| JP | 2002-299833 | 10/2002 |
| JP | 2002-324966 | 11/2002 |
| JP | 2003-149831 | 5/2003 |

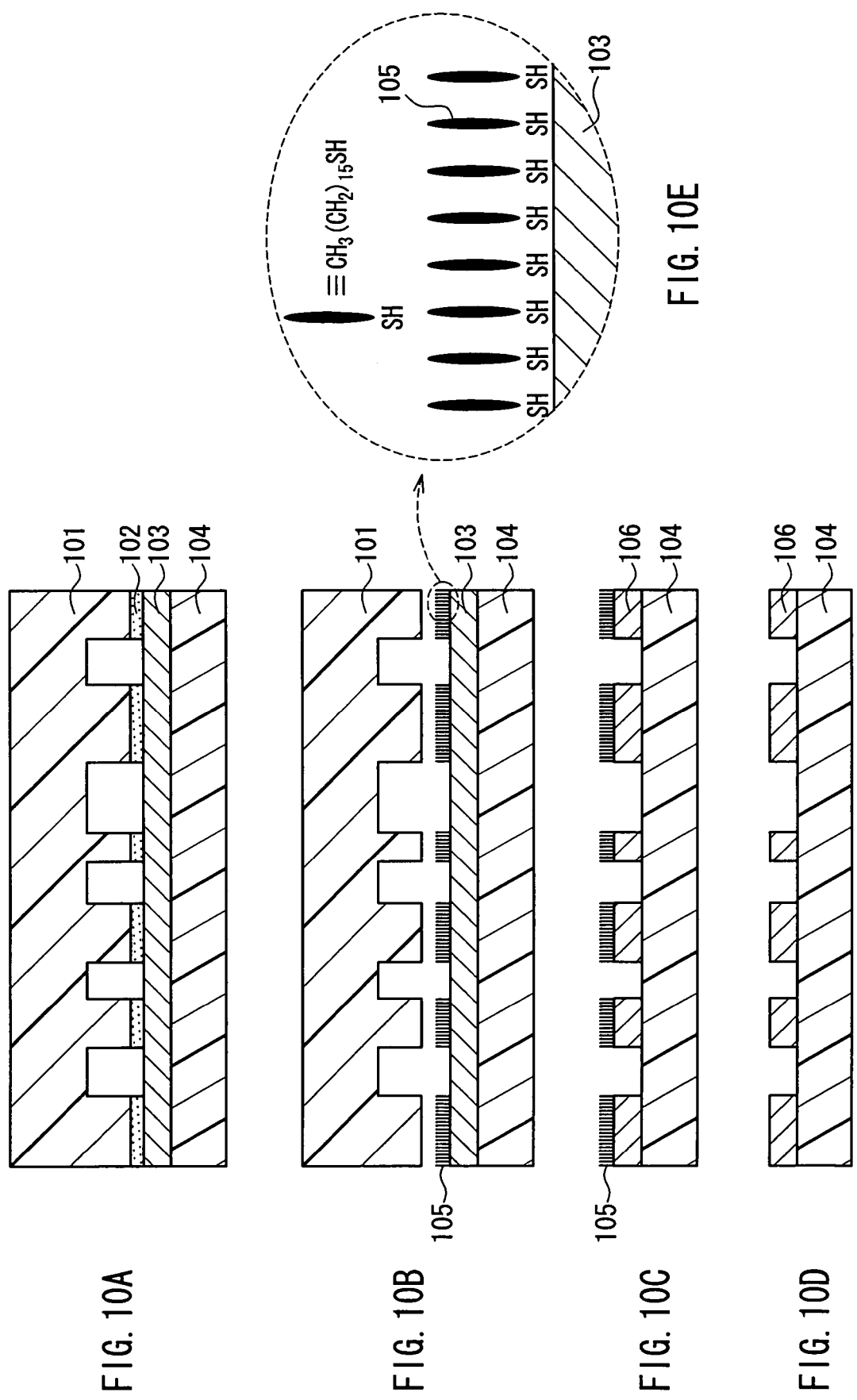

METAL PATTERN AND PROCESS FOR PRODUCING THE SAME

TECHNICAL FIELD

The present invention relates to a metal pattern that can be formed by micromachining, and a method for producing the same.

BACKGROUND ART

Conventionally, a pattern of a metal is formed by photolithography. An outline of the photolithography technique is described as follows. A resist solution is applied by spin-coating over a substrate on which a metal film is formed, and drying at a low temperature is performed so that excess solution is removed. Next, a photomask is caused to adhere to the substrate, and is irradiated with ultraviolet radiation. By so doing, regions having been irradiated with light (hereinafter referred to as irradiated regions) and regions not having been irradiated with light (hereinafter referred to as non-irradiated regions) are formed on a surface of the resist film. The irradiated regions and the non-irradiated regions have different resistances with respect to a resist developer. Next, the substrate is exposed to the resist developer so that the resist on the irradiated regions is removed (in the case where a positive-type resist is used) or the resist on the non-irradiated regions is removed (in the case where a negative-type resist is used). Thereafter, the density of the resist is increased by annealing the substrate at a high temperature, so that the resistance with respect to an etching solution is increased. Next, by exposing the substrate to the etching solution, the metal in the region not covered with the resist film is removed. Finally, the resist is removed by a resist peeling solution, whereby a metal pattern is formed. The photolithography method is an indispensable technique for forming semiconductor devices, with which patterns on sub-micron orders can be formed easily with accuracy at present.

The photolithography method is very useful as a metal patterning method, but it has several problems. The first problem is waste of materials, i.e., 90% or more of the resist solution is wasted in the resist application process. The second problem arises in that a large amount of an organic solvent, which possibly is harmful to the environment, has to be used in the developing and removing processes, and this is unfavorable from the viewpoint of the environmental protection. The third problem is in that in the case where various types of products are to be manufactured in small volumes, respectively, a costly photomask has to be produced for each of the product types, which increases the manufacturing costs. Still further, the photolithography method involves many steps, and if a method involving a smaller number of steps is developed, it will leads to a decrease in the manufacturing costs.

Recently, to solve the foregoing problems of the photolithography method, a metal pattern forming method employing the ink jet method, and that employing the microstamping method have been proposed. The following describes these methods.

(1) Metal Pattern Forming Method Employing the Ink Jet Method

This utilizes the techniques of the ink jet printer. The mechanism of the drawing by the ink jet printer (hereinafter referred to as ink jet method) is as follows: ink is jetted from a plurality of nozzle holes with a diameter of several tens µm each, formed in a nozzle plate, in amounts of several picoliters, respectively, toward a printing material such as paper, so that the jetted ink is arranged at a predetermined position on the printing material. To arrange the ink at predetermined positions on a recording medium, the ink is jetted by moving the nozzle plate and the printing material mechanically to control relative positions thereof. In principle, lines with widths on the submicron orders can be drawn by decreasing the size of the nozzle hole or devising the manner of how a liquid is jetted.

By jetting a metal paste by the ink jet method for drawing on a substrate, a metal pattern can be formed. By this method, the jetted material can be used without waste, which results in resource savings, and further, since the processes for developing and removing a resist are omitted, the use of a large amount of organic solvents can be avoided, which is favorable from the viewpoint of the environmental protection. Still further, since in the method employing the ink jet method, a liquid is jetted by using digital data prepared on computer so that a pattern is formed directly on a substrate, a costly photomask is unnecessary. Besides, since the exposing and developing processes can be omitted, small-volume manufacturing of a variety of products is possible at lower costs.

Alternatively, the process of drawing on a metal film with a resist solution by the ink jet method, and subsequently the etching and resist removing processes may be carried out, whereby a metal pattern can be formed also. By this method, only a minimum amount of a resist material is used, which results in resource savings. Further, since in the method employing the ink jet method, a liquid is jetted by using digital data prepared on computer so that a pattern is formed directly on a substrate, a costly photomask is unnecessary. Besides, since the exposing and developing processes can be omitted, small-volume manufacturing of a variety of products is enabled at lower costs.

Patent Documents 1 and 2 shown below propose methods for forming a metal wiring pattern in the following manner: a paste obtained by dispersing ultrafine metal particles with an average particle diameter of 1 nm to 10 nm in a resin composition is jetted by the ink jet method so that a metal wiring pattern is formed.

Patent Document 3 shown below proposes a method for forming a metal wiring in the following manner: a liquid metal in which particles having a sulfur compound adsorbed to their surfaces are dissolved is jetted by the ink jet method so that a metal wiring is formed.

Patent Document 4 shown below proposes a method for forming a circuit in the following manner: a circuit pattern is formed by jetting a metal particle ink by the ink jet method, the ink being obtained by dispersing metal particles with an average particle diameter of not more than 100 nm in water or an organic solvent, and thereafter, a treatment with heat or light is carried out so that polymers or a surfactant contained in the circuit pattern are discomposed or volatilized.

Patent Document 5 proposes a step of jetting a liquid resin through a jet head so as to form a desired pattern image on a substrate and hardening the formed pattern image with heat, an uncovered region corroding step of exposing the substrate having the hardened pattern image to an etching solution so that regions of the substrate not covered with the foregoing patterning resin are corroded, and a step of removing the pattern image that is no longer necessary.

Patent Document 6 shown below proposes a method for forming a pattern in the following manner: an ink that is solid in normal temperature and molten with heat is jetted in a molten state by the ink jet method so that a pattern is drawn on a conductive layer, and the conductive layer is etched so that the pattern is formed.

(2) Metal Pattern Forming Method Employing the Microcontact Printing Method

FIGS. 10A to 10E are schematic views showing steps of a method for forming a metal pattern by the microcontact printing method. A stamp 101 formed with a silicone resin is impregnated with an ethanol solution containing an alkane thiol (in the drawings, hexadecane thiol, $CH_3(CH_2)_{15}SH$, is used), and the stamp 101 is pressed against a surface of a metal film 103 of gold, copper, or the like (FIG. 10A). By so doing, a pattern 105 of a monomolecular film of the alkane thiol is formed on the metal surface (FIG. 10B). Then, the metal is exposed to an etching solution so that a metal pattern 106 is formed (FIG. 10C). Thereafter, the monomolecular film is removed by using ozone or applying heat (FIG. 10D) (Non-Patent Document 1 below). 104 denotes a substrate. An alkane thiol has a property of being bound with a metal via SH by stamping and forming a monomolecular film 105 with a thickness of 1 nm to 3 nm (FIG. 10E). The monomolecular film, filled with molecules densely, does not allow the etching solution to permeate therethrough, and therefore, functions as a resist film for a metal. 102 denotes stamp regions impregnated with the alkane thiol, and 105 denotes the monomolecular film of the alkane thiol adsorbed to the metal film. It is also shown that the method enables the formation of a gold pattern with a width on a submicron order (Non-Patent Document 2 below). The stamping method requires a minimum amount of an alkane thiol as compared with the spin coating method, which results in resource savings. Further, since the exposing and developing steps are omitted, the number of steps decreases as compared with the photolithography method, which leads to the reduction of manufacturing costs. Still further, since the alkane thiol monomolecular film can be removed easily by a heat treatment at 100° C. or a higher temperature or by applying ozone, the use of a toxic organic solvent for removing a resist can be omitted, which decreases environmental loads.

The methods of Patent Documents 1 to 4 in which a metal paste is jetted by the ink jet method for drawing solve the problems of the photolithography method, but since the metal paste in the state of just being drawn has only a low conductivity, it is necessary to increase the conductivity by annealing. To obtain a conductivity at the same level as that of a metal used in the photolithography method, ideally the annealing at a temperature near the melting point of the metal is carried out. However, at such a temperature, a normal substrate is denatured due to heat. Accordingly, it is necessary to anneal the substrate at as low a temperature as possible. Particularly, in the case where the substrate is a printed substrate made of a resin, the annealing temperature preferably is not higher than 200° C. Therefore, the metal pattern formed by the ink jet method has a low conductivity, as compared with that formed by the normal photography method. Particularly in circuit wiring, a decrease in the conductivity is a significant problem since it leads to deterioration of the device performance.

In the cases of the methods of Patent Documents 5 and 6 in which a resist solution is jetted by the ink jet method, since a metal film used in the conventional photolithography method is used, a decrease in the conductivity does not occur, unlike the case where a metal paste is used. However, in the case where a resist solution is jetted by the ink jet method for drawing on a substrate, the jetted solution 111 spreads on the substrate 112 as shown in FIGS. 11A to 11C. 113 denotes the solution upon being brought into contact with the substrate, and 114 denotes the solution in a spreading state. Here, the spreading of the solution refers to a phenomenon in which an area in which the solution and the substrate are in contact with each other increases significantly as compared with an area of a cross section of the solution when being jetted out of the nozzle holes ($4\pi R^2$ where R represents a diameter of the solution). Depending on wettability of the substrate and properties of the jetted solution, the contact area sometimes increases to 10000 or more times the area of the cross section of the jetted solution drop. In the case where a solution is jetted in a region 121 as shown in FIG. 12A, if the solution does not spread, it is possible to form an accurate pattern 122 of the solution as shown in FIG. 12B, but if the solution spreads, only a blurred, inaccurate pattern as shown in FIG. 12C is formed. 123 denotes a region in which a pattern should be formed, and 124 denotes an actually formed pattern of the solution.

According to a method of Non-Patent Document 1 employing the microcontact printing method, a monomolecular film is formed only in a portion in which a stamp is in contact, and therefore, the obtained pattern rarely blurs. However, a stamp has to be prepared for each pattern, and hence, this method is not suitable for the manufacturing of a variety of products in small volumes.

Patent Document 1: JP 2002-299833 A
Patent Document 2: JP 2002-324966 A
Patent Document 3: JP10(1998)-204350 A
Patent Document 4: JP 2002-13487 A
Patent Document 5: JP 3245410 B
Patent Document 6: JP 2000-340928 A
Non-Patent Document 1: Applied Physics Vol. 63, p.4, 1993
Non-Patent Document 2: Synthetic Metals Vol. 115, p. 5, 2000

DISCLOSURE OF INVENTION

To solve the above-described problems of the prior art, it is an object of the present invention to provide an accurate metal pattern without blurring, by causing specific molecules to enter interstices between specific molecules composing a monomolecular film so as to form a masking film, and to provide a method for producing the foregoing metal pattern.

A metal pattern of the present invention is a metal pattern formed on a surface of a substrate by etching, and the metal pattern is characterized in that: a monomolecular film containing fluorinated alkyl chains ($CF_3(CF_2)_n$—, where n represents an integer) is formed on a surface of a metal film composing the metal pattern; and a masking film is formed by penetration of a molecule having a mercapto group (—SH) or a disulfide (—SS—) group into interstices between molecules composing the monomolecular film.

A metal pattern producing method of the present invention is a method for forming a metal pattern on a surface of a substrate by etching, and the method is characterized by comprising the steps of: forming a monomolecular film containing fluorinated alkyl chains ($CF_3(CF_2)_n$—, where n represents an integer) on a surface of a metal film; forming a masking film by applying a solution in which a molecule having a mercapto group (—SH) or a disulfide (—SS—) group is dissolved over a surface of the monomolecular film so that the molecule having a mercapto group (—SH) or a disulfide (—SS—) group penetrates in interstices between molecules composing the monomolecular film; and etching the metal film by exposing the surface of the metal film to an etching solution so that a portion of the metal film in a region not covered with the masking film is removed so that the metal pattern is formed.

BRIEF DESCRIPTION OF DRAWINGS

FIG. 10A is a schematic view for explaining the conventional microcontact printing method, which is a schematic cross-sectional view showing a state in which a stamp impregnated with an alkane thiol is pressed against a metal film. FIG. 10B is a schematic cross-sectional view showing a state in which, by pressing the stamp, a monomolecular film pattern of the alkane thiol is formed on the metal film. FIG. 10C is a schematic cross-sectional view showing a state after etching. FIG. 10D is a schematic cross-sectional view showing a state after the alkane thiol monomolecular film on the metal is removed therefrom. FIG. 10E is a schematic cross-sectional view on the molecular level showing a state of the alkane thiol monomolecular film formed on the metal film.

DESCRIPTION OF THE INVENTION

Figure 1A:
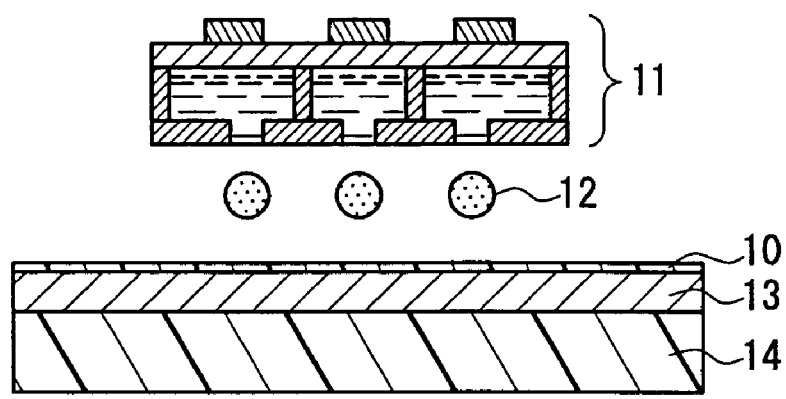
FIG. 1A is a schematic cross-sectional view illustrating a state in which a solution is jetted by the ink jet method toward a metal film formed on a substrate according to an Example of the present invention.

As a metal pattern of the present invention, an accurate metal pattern without blurring is obtained, since a monomolecular film containing fluorinated alkyl chains ($CF_3(CF_2)_n$—, where n represents an integer) is formed on a metal film surface, and a masking film is formed by penetration of molecules having a mercapto group (—SH) or a disulfide (—SS—) group into interstices between molecules composing the monomolecular film. The masking film has water-repellent and soil-resistant properties.

The metal pattern producing method of the present invention allows a pattern to be formed by jetting a solution in a minimum required amount, which leads to savings in materials. Besides, a pattern to be formed can be drawn directly on a substrate without using a costly photomask, and the exposing and developing steps can be omitted, which allows a variety of products to be manufactured in small volumes at low costs. Still further, the molecule having a mercapto group or a disulfide group, which is used for forming a resist film, can be removed easily by a heat treatment at a temperature of 100° C. or above or a treatment with ozone, and the use of a remover used in the photolithography method, which adversely affects the environment, can be avoided, which is advantageous from the view point of the environmental protection.

In the metal pattern of the present invention, the monomolecular film containing fluorinated alkyl chains preferably is formed with a molecule having a mercapto group or a disulfide group (—SS—), or a molecule composing a silane coupling agent, in a state of being adsorbed to the metal surface. Here, the adsorption refers to both of the physical adsorption to the metal surface, and the binding by a covalent bond obtained by dealcoholization or dehydrohalogenation. The molecular film formed by this method usually is called "chemisorption film" or "self-assemble film" in the art.

In the present invention, the molecule having a mercapto group or a disulfide group, used for forming a masking film, preferably is an alkane thiol $(CH_3(CH_2)_nSH$, where n is an integer), or an alkyl dithiol $(CH_3(CH_2)_qSS(CH_2)_rCH_3$, where q and r are natural numbers, respectively). More preferably, n, q, and r are in a range of 7 to 17.

The metal pattern may have a liquid-dropped trace. This is a trace remaining in the case where a masking film forming solution is applied by the ink jet method.

The metal film preferably contains at least one metal selected from gold, silver, copper, platinum, gallium arsenide, and indium phosphide.

The masking film has water-repellent and soil-resistant properties.

The substrate may be a silicon substrate or a SiC substrate, but preferably it is a resin substrate formed with polyimide, epoxy, polyamide, polyester, or the like. It may be formed in any shape, for instance, it may be a film substrate, a multilayer substrate, or the like.

The foregoing metal pattern preferably is a wiring pattern or a decorative pattern.

Further, after the metal pattern is formed, molecules adsorbed to the surface of the metal film preferably are removed by subjecting a surface of the metal film to a heat treatment at 100° C. or above, or by exposing the surface of the metal film to ozone.

Methods for forming the metal pattern according to the present invention are as follows.

(1) Metal Pattern Forming Method 1:

A metal pattern forming method according to the present invention includes the steps of: forming a monomolecular film with a covering rate of less than 1 that contains fluorinated alkyl chains $(CF_3(CF_2)_n$, where n represents an integer, preferably in a range of 0 to 12) on a metal film surface; jetting a solution in which a molecule having a mercapto group (—SH) or a disulfide group (—SS—) is dissolved by the ink jet method so as to form a pattern of the solution on the metal film surface; volatilizing a solvent of the solution on the metal film surface; and exposing the metal film surface to an etching solution so that only a metal region not covered with the pattern is etched.

Here, the covering rate of the monomolecular film is defined as a value obtained by dividing the number of molecules composing a certain monomolecular film per unit area by the number of the same molecules composing a monomolecular film with a covering rate of 1 per unit area. The monomolecular film with a covering rate of 1 refers to a film packed with the molecules thereof without interstices in the film, through which ions or molecules cannot penetrate to arrive to a substrate surface on which the monomolecular film is formed. In the present invention, such a closely packed film is not used, but a state is formed such that interstices into which other molecules or ions can enter are present among molecules composing the monomolecular film. More specifically, it is necessary to devise schemes such as diluting chemisorption molecules with a non-aqueous solvent so as to be used in a state of a dilute solution, or controlling a time of reaction between chemisorption molecules and a metal surface so that the time does not exceed the necessary duration. It should be noted that the lower limit of the covering rate of the monomolecular film preferably is 0.1, more preferably 0.2. In the case where the covering rate is not less than 0.1, the water-repellency is obtained, while in the case where the covering rate is not less than 0.2, the water-repellency is improved.

FIGS. 1A to 1D are schematic views for explaining an example of the present invention. FIG. 1A is a schematic view showing a state in which a solution 12 in which a molecule having a mercapto group or a disulfide group is dissolved is jetted from an ink jet head 11 to a metal film. 14 denotes a substrate, 13 denotes the metal film, and 10 denotes a base layer composed of a monomolecular film.

Figure 1B:
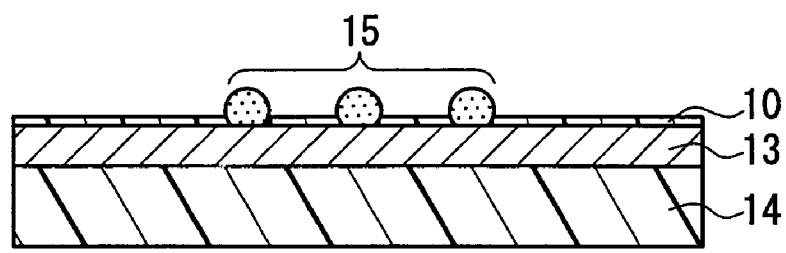
FIG. 1B is a schematic cross-sectional view showing a state in which the solution jetted by the ink jet method adheres to a surface of the metal.

As shown in FIG. 1B, in the example of the present invention, since the base layer 10 formed with a monomolecular film having fluorinated alkyl chains is formed on a surface of the metal film 13 in advance, the surface has water-repellency like a fluorocarbon resin. Accordingly, the solution 12 jetted by the ink jet method rarely spreads on the base layer 10, thereby allowing a pattern 15 of the solution to be formed without blurring.

Figure 1C:
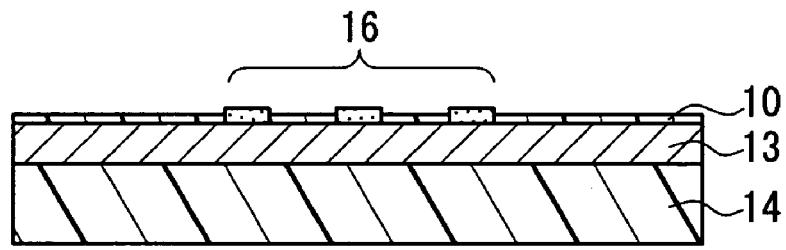
FIG. 1C is a schematic cross-sectional view showing a state after a solvent in the solution is removed by drying.
Figure 1D:
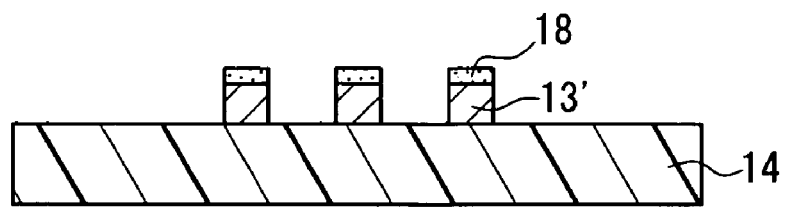
FIG. 1D is a schematic cross-sectional view showing a state in which a metal pattern is formed by etching.
Figure 1E:
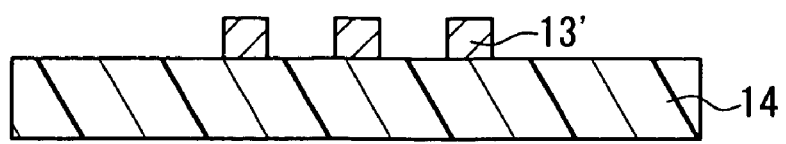
FIG. 1E is a schematic cross-sectional view showing a state after a masking film on the metal pattern is removed.

Subsequently, by removing the solvent by drying, a pattern 16 without blurring is formed as shown in FIG. 1C, which is formed with an aggregation of molecules having mercapto groups. Here, since the base layer 10 composed of the monomolecular film having fluorinated alkyl chains has a covering rate of less than 1, molecules having mercapto groups or disulfide groups penetrate the monomolecular film and arrive at the surface of the metal film 13, where the mercapto groups or the disulfide groups are bound with the metal, thereby forming a film resistant to an etching solution. Besides, since the base layer 10 composed of the monomolecular film having fluorinated alkyl chains has a covering rate of less than 1, in regions in which a pattern of the solution is not formed, metallic corrosion ions in the etching solution pass through the film and arrive to the surface of the metal, whereby the metal in the regions is etched. Therefore, when the metal film on which a solution pattern is formed by the ink jet method is exposed to an etching solution, metal remains only in regions where molecules having mercapto groups or disulfide groups are present, as shown in FIG. 1D, whereby a desired metal pattern 13' is formed. 18 denotes a masking film formed on the metal film. In this state, since the masking film has water-repellent and soil-resistant properties, the masking film can be used as a protective film. Further, the masking film also has an anticorrosive property. Still further, wires or the like can be connected electrically by wire bonding or soldering on the metal pattern 13' in a state in which the masking film is present thereon. FIG. 1E shows a state in which the masking film 18 is removed.

Figure 13A:
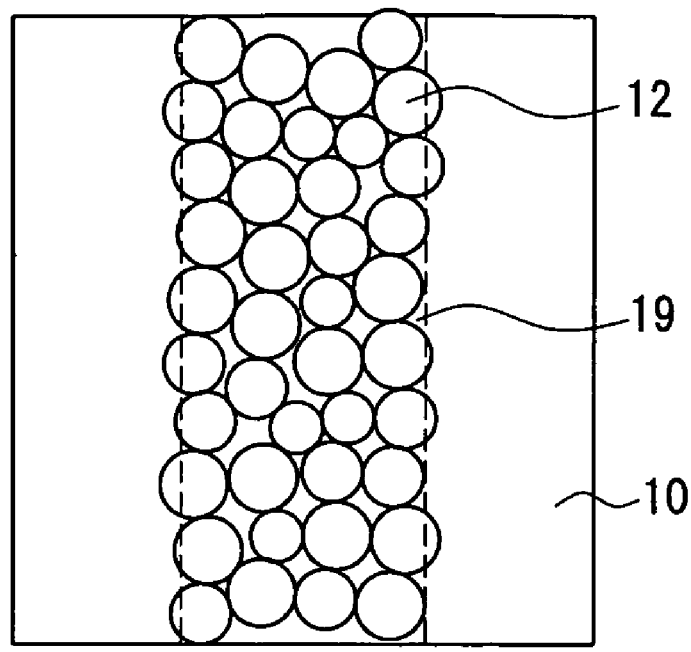
FIG. 13A is a plan view showing a state in which a solution in which a molecule having a mercapto group or a disulfide group is dissolved is jetted on a wiring region on a monomolecular film formed on a metal surface on a substrate in an example of the present invention.
Figure 13B:
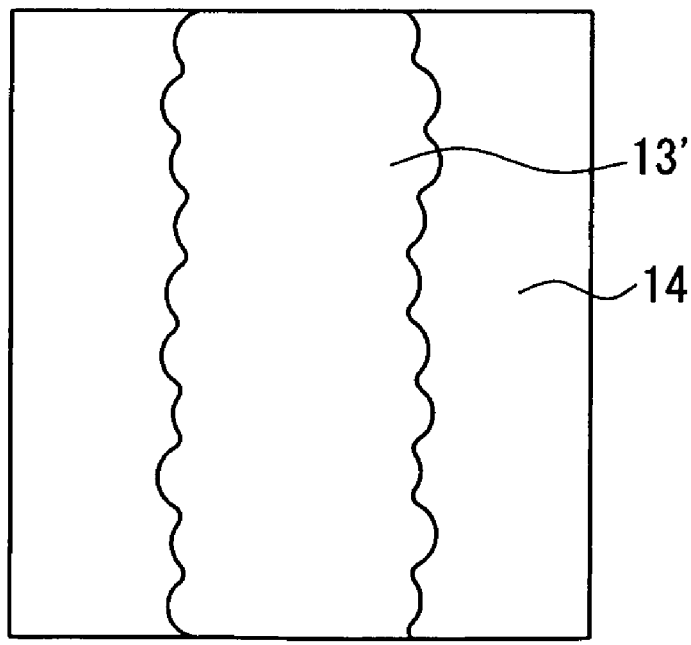
FIG. 13B is a plan view showing a metal pattern having a trace obtained after etching.

FIGS. 13A and 13B are plan views showing examples of steps of production of the metal pattern to be formed in the foregoing manner. FIG. 13A is a plan view corresponding to FIG. 1B, showing the state in which the solution 12 in which a molecule having a mercapto group or a disulfide group is dissolved is jetted onto a wiring regions 19 on the monomolecular film 10 formed on the metal surface of the substrate. Since the monomolecular film has a water-repellent property, the jetted solution 12 adheres to the monomolecular film while maintaining the circular shape. The solution 12 is dried in the foregoing state and the etching is carried out, and a state as shown in FIG. 13B (plan view corresponding to the FIG. 1D) is obtained, which shows that a trace of the jetted solution 12, though being very minute, remains on side faces of the metal pattern 13.

As described above, the present invention allows a metal pattern without blurring to be formed. The principles of the formation of a metal pattern without blurring by the present invention are described more specifically, regarding the items (A) to (C) below.

Figure 2A:
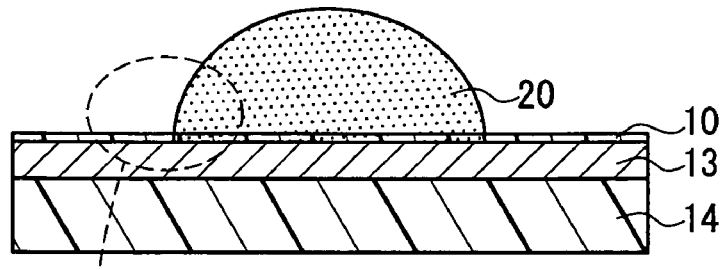
FIG. 2A is a schematic sectional view showing a state in which a solution with a molecule having a mercapto group dissolved therein is dropped on a metal film covered with a monomolecular film.
Figure 2B:
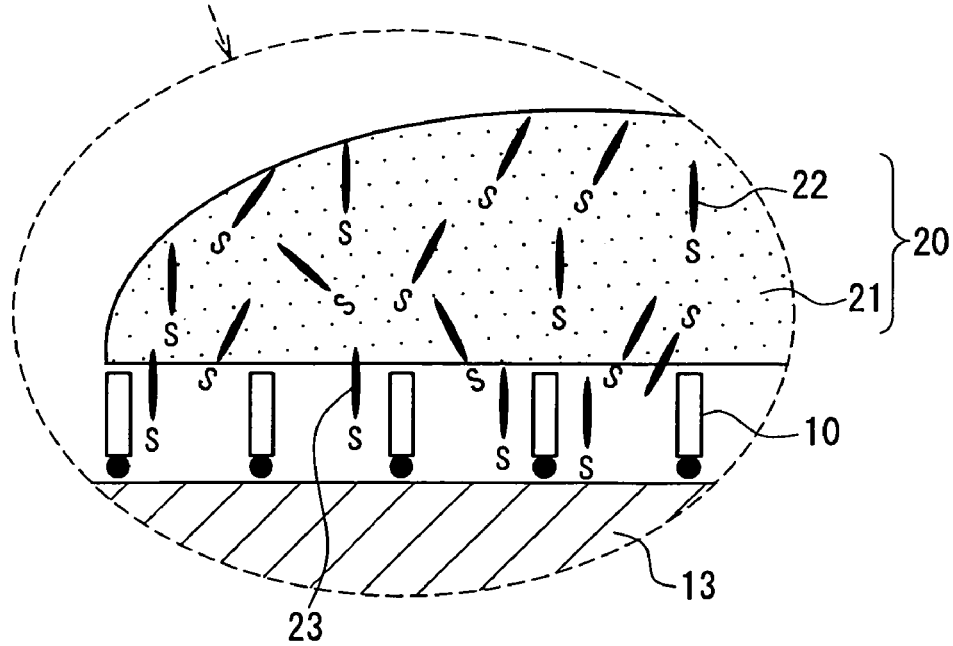
FIG. 2B is a schematic enlarged cross-sectional view showing a part encircled by a dotted line in FIG. 2A.

(A) Property 1 of the Monomolecular Film with a Covering Rate of Less Than 1: the Property Allowing a Molecule Having a Mercapto Group Or a Disulfide Group to Penetrate Therethrough FIG. 2A is a schematic view showing the case where a solution 20 in which a molecule having a mercapto group or a disulfide group is dissolved (the figure shows only the case of the solution containing the molecule having a mercapto group) is dropped onto a metal film 13 covered with a monomolecular film 10 with a covering rate of less than 1 having fluorinated alkyl chains. 14 denotes a substrate, and 21 denotes a solvent. The inventors of the present invention found that the solution is repelled on a metal covered with a monomolecular film with a covering rate of less than 1 and does not spread over. FIG. 2B is an enlarged view of a portion encircled by a dotted line in FIG. 2A, which is a schematic view showing the state of an interface between a liquid and a monomolecular film on the molecular level. The inventors found that, as shown in FIG. 2B, in the monomolecular film with a covering rate of less than 1, molecules 10 having fluorinated alkyl chains are adsorbed to the metal film 13 with interstices therebetween, and therefore, molecules 23 having mercapto groups or disulfide groups in the solution (the figure shows only molecules having mercapto groups) enter the interstices between the molecules 10 composing the monomolecular film, and are adsorbed to the metal film 13, thereby forming a dense film resistant to an etching solution.

Figure 3A:
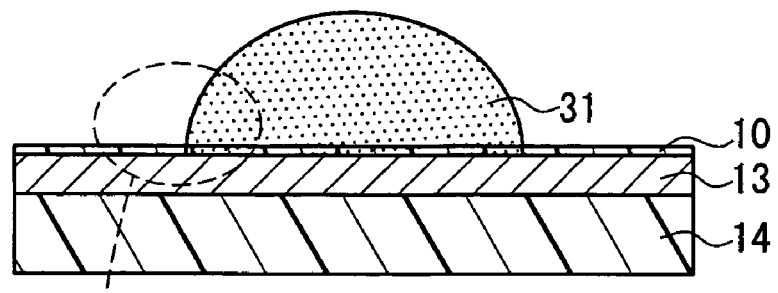
FIG. 3A is a schematic cross-sectional view showing a state in which an etching solution is dropped on a surface of a metal film covered with a monomolecular film.
Figure 3B:
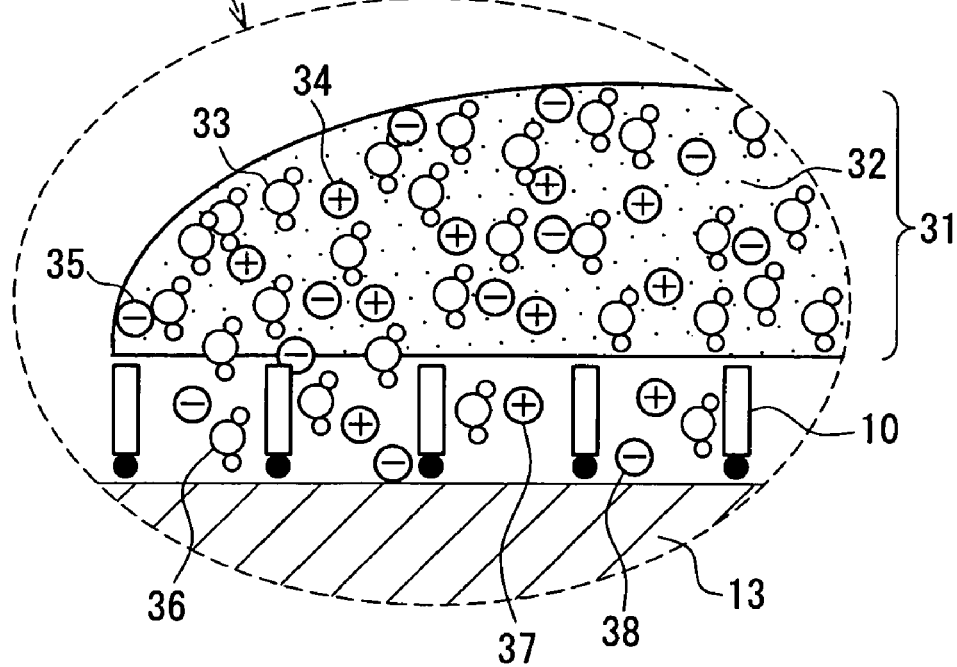
FIG. 3B is a schematic enlarged cross-sectional view showing a part encircled by a dotted line in FIG. 3A.

(B) Property 2 of the Monomolecular Film with a Covering Rate of Less Than 1:

FIG. 3A is a schematic view showing the state of an etching solution 31 dropped onto a metal film 13 covered with a monomolecular film 10 with a covering rate of less than 1 having fluorinated alkyl chains. 32 denotes a solvent. FIG. 3B is an enlarged view of a portion encircled by a dotted line in FIG. 3A, which is a schematic view showing the state of an interface between the etching solution and a monomolecular film on the molecular level. As shown in FIG. 3A, the metal 13 covered with the monomolecular film 10 with a covering rate of less than 1 has a property of repelling the etching solution 31. The inventors found that, as shown in FIG. 3B, a monomolecular film with a covering rate of less than 1 containing fluorinated alkyl chains has a property of allowing water molecules 33 and 36 and ions 34, 35, 37, and 38 contained in the etching solution 31 to penetrate therethrough. 10 denotes a molecule composing the monomolecular film.

Figure 4A:
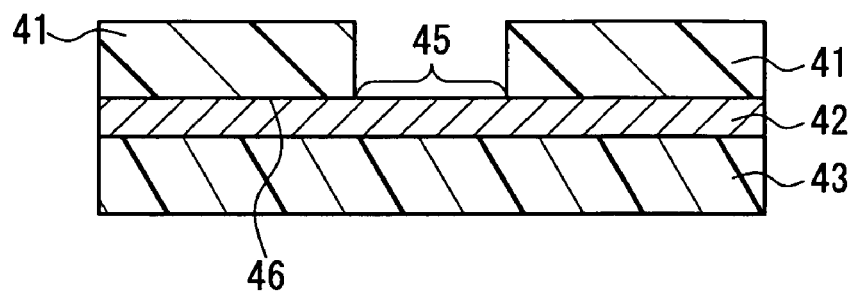
FIG. 4A is a schematic cross-sectional view showing a metal film covered with a resist film pattern.
Figure 4B:
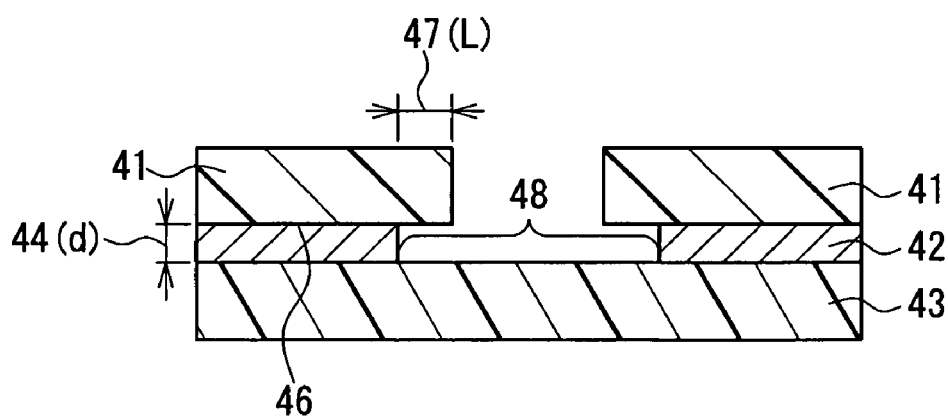
FIG. 4B is a schematic cross-sectional view showing a state of the metal film covered with the resist pattern after etching.

The following describes the reason why when metal covered with a monomolecular film with a covering rate of less than 1 is exposed to an etching solution, the metal and the monomolecular film are removed from a substrate completely. FIG. 4A is a schematic view showing a metal film 42 covered with a resist pattern, and FIG. 4B is a schematic view showing a state of the metal film 42 after etching. 43 denotes a substrate. The etching solution etches portions of a metal surface 45 not covered with a resist film 41, and penetrates to an interface 46 between the resist film 41 and the metal, thereby etching portions of the metal under the resist film (this phenomenon is referred to as underetching). As a result, the metal film after the etching is, as shown in FIG. 4B, in a form such that the metal 42 under the resist film 41 slightly disappears and an aperture 48 is formed. Let a range 47 of underetching and a thickness of the metal be L and d, respectively, and generally L>d is derived. As the etching time increases, L increases.

Figure 5A:
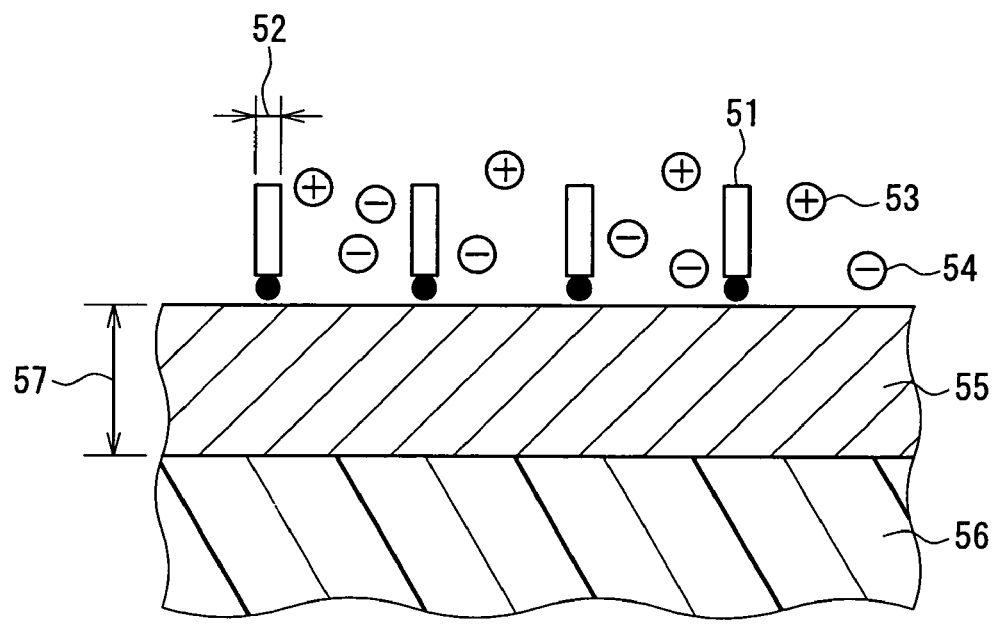
FIG. 5A is a schematic cross-sectional view on the molecular level showing a state in which the metal film with a monomolecular film formed thereon is exposed to an etching solution.
Figure 5B:
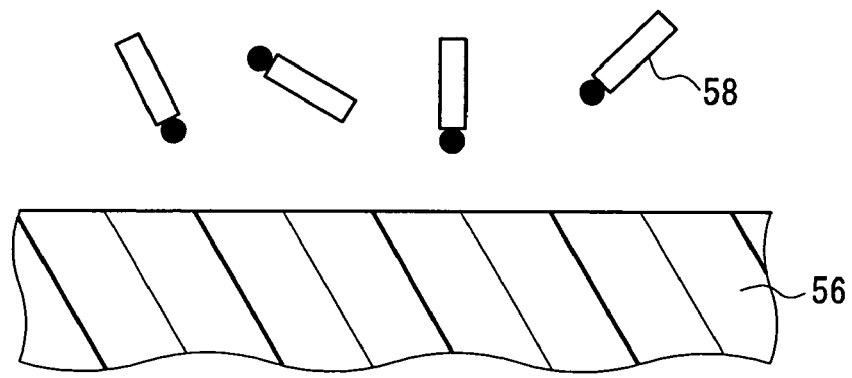
FIG. 5B is a schematic cross-sectional view illustrating a state in which the metal and the monomolecular-film-forming molecule are removed from the substrate by the etching.

Generally, in the monomolecular film with a covering rate of less than 1, in many cases, the molecules composing the film are separated from one another, scattered, and dispersed homogeneously. FIG. 5A is a schematic view showing, on a molecular level, a state in which a metal film covered with such a monomolecular film is exposed to an etching solution. Molecules 51 composing the monomolecular film are adsorbed to a surface of a metal film 55, being separated from one another and scattered. 52 denotes a width of a molecule composing the monomolecular film. Positive ions 53 and negative ions 54 etch the metal film 55. As shown in the drawing, since the ions reach the metal from around each molecule, portions of the metal around the molecules are etched. Usually, an area occupied by a molecule composing a monomolecular film on a substrate is approximately $0.3 \text{ nm}^2$. A thickness 57 of the metal film 55 is normally several nanometers or more. Therefore, in underetching, portions of the metal under the individual molecules disappear due to the etching. Accordingly, when a metal film covered with a monomolecular film with a covering rate of less than 1 is exposed to an etching solution, the film and the metal both are removed completely (FIG. 5B). 56 denotes the substrate, and 58 denotes a molecule liberated upon the etching of the metal film.

Figure 6A:
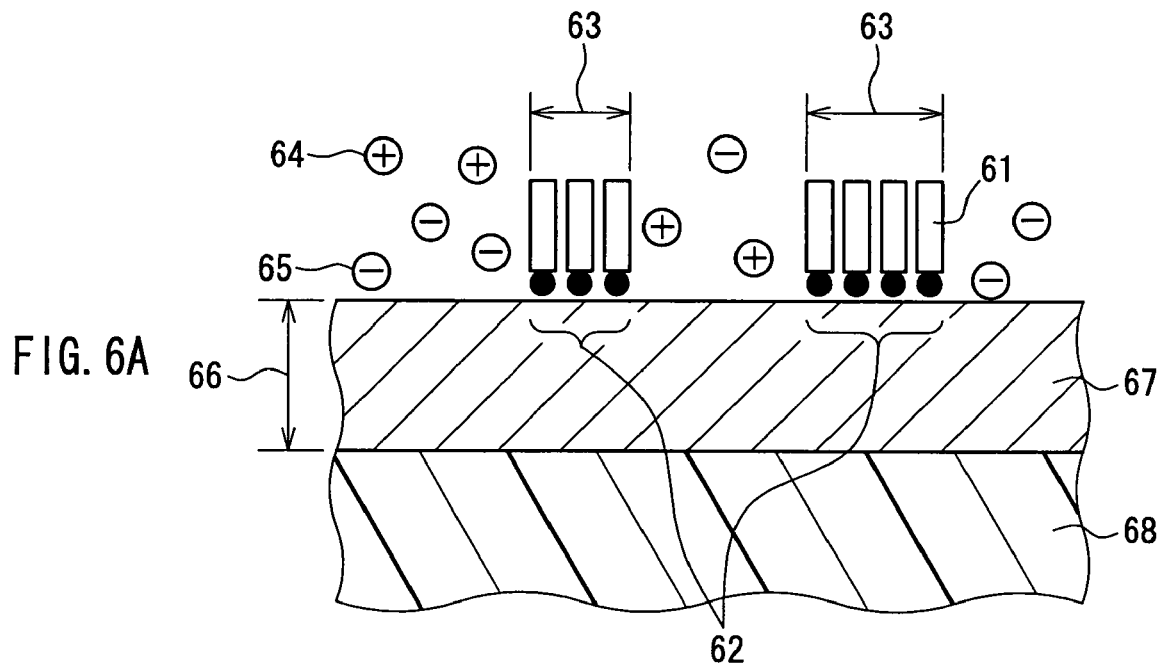
FIG. 6A is a schematic cross-sectional view on the molecular level showing a state in which the metal film with a monomolecular film formed thereon is exposed to an etching solution.
Figure 6B:
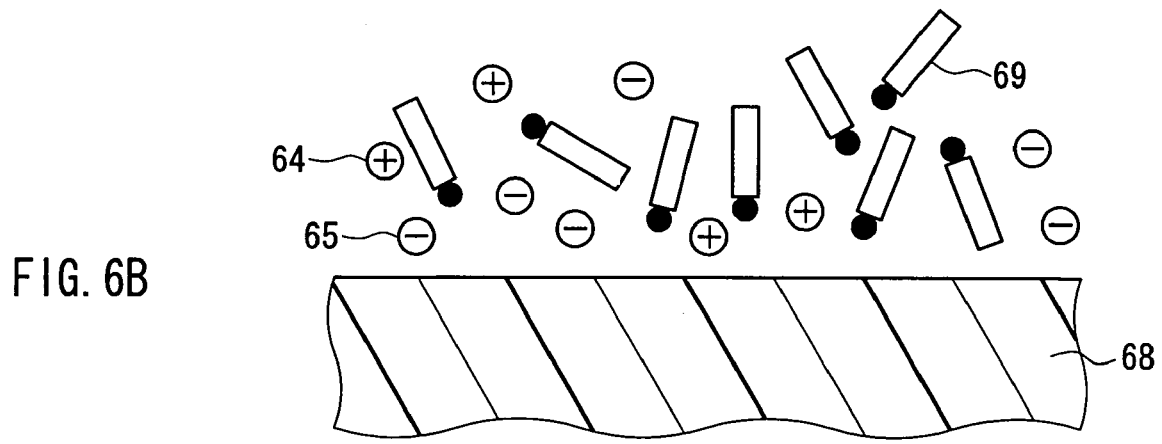
FIG. 6B is a schematic cross-sectional view illustrating a state in which the metal and the monomolecular-film-forming molecule are removed from the substrate by the etching.

Among monomolecular films with a covering rate of less than 1, there are monomolecular films in which molecules are scattered non-homogeneously. FIG. 6A is a schematic view showing, on a molecular level, a state in which a metal film covered with such a monomolecular film is exposed to an etching solution. As shown in the drawing, molecules 61 composing a monomolecular film and having fluorinated alkyl chains form a configuration such that regions in which the molecules 61 are provided densely (referred to as islands) are scattered. In this case, if a dimension 63 of the island (a diameter if the shape of the island is approximated to a circle) is smaller than a thickness 66 of the metal film, the metal under the monomolecular film is removed by underetching, and therefore, the metal film 67 is removed entirely by etching (FIG. 6B). 68 denotes a substrate, 64 denotes a positive ion in the etching solution, 65 denotes a negative ion in the etching solution, and 69 denotes a molecule liberated upon the etching of the metal film.

It should be noted that as the covering rate of the monomolecular film is closer to 1, the interstices among molecules composing the monomolecular film are narrowed, or the islands shown in FIG. 6A become larger. In the case where the covering rate is 1, the monomolecular film does not allow the etching solution to permeate the film itself, and the metal film is not etched at all.

The manner of etching of a metal film covered with a monomolecular film with a covering rate of approximately 1 varies depending on the type of the metal film and the type of the molecules composing the monomolecular film, and the behaviors thereof are complicated.

Here, a case where molecules composing a monomolecular film are distributed homogeneously so as to make an in-plane density uniform through an entire region of a surface of a metal film is considered. In this case, if a covering rate of a monomolecular film in which an interstice between molecules is equal to a radius of an ion in an etching solution is assumed to be X, the metal is etched throughout the entire region in the case where the covering rate of the film is less than X, whereas the metal is etched not entirely in the region in the case where the covering rate of the film is more than X. However, the molecules composing the monomolecular film actually are not distributed homogeneously on the metal surface, but the in-plane density of the molecules varies with locations. Therefore, if a covering rate of a monomolecular film on a metal is nearly 1, regions of the monomolecular film resistant to the etching solution and regions thereof not resistant to the etching solution are distributed non-homogeneously on the metal surface. As a result, when a metal film covered with such a monomolecular film is exposed to an etching solution, non-etched metal regions and etched metal regions coexist.

Further, a case of a monomolecular film configured with aggregations of islands as shown in FIG. 6A is considered. In this case, in the case where the dimension 63 of each island is larger than the thickness of a metal film, metal under the islands is not etched. Normally, the size of an island and the distance between islands vary with locations on the metal film surface. Therefore, if a covering rate of a monomolecular film is nearly 1, islands having dimensions larger than the metal film thickness and islands having dimensions smaller than the metal film thickness are distributed non-homogeneously on the metal film surface. As a result, when a metal film covered with such a film is exposed to an etching solution, etched regions and non-etched metal regions coexist. 69 denotes a molecule liberated upon the etching of the metal film.

As described above, it is difficult to logically derive a value of a covering rate of a monomolecular film required to etch an entirety of a metal film. Therefore, the covering rate of the monomolecular film used in the present invention has to be determined by experiments case by case, regarding each type of the monomolecular film and the metal.

Figure 7A:
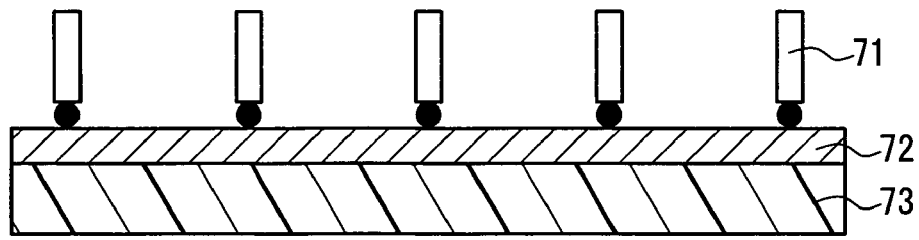
FIG. 7A is a schematic cross-sectional view showing a metal film on which a monomolecular film is formed.
Figure 7B:
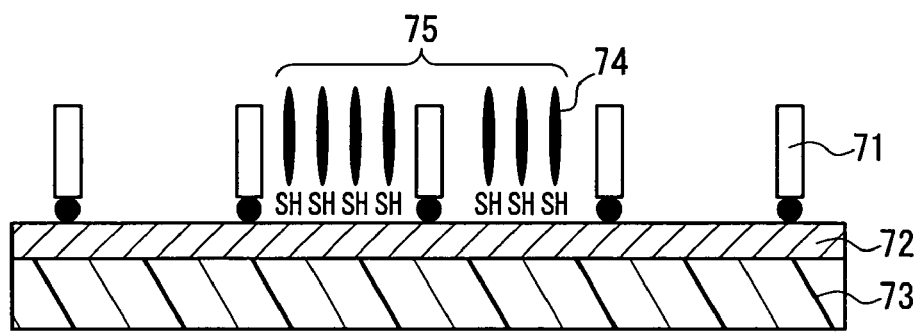
FIG. 7B is a schematic cross-sectional view showing a state of a metal interface when a solution containing a mercapto group is dropped on the monomolecular film and penetrates therein.
Figure 7C:
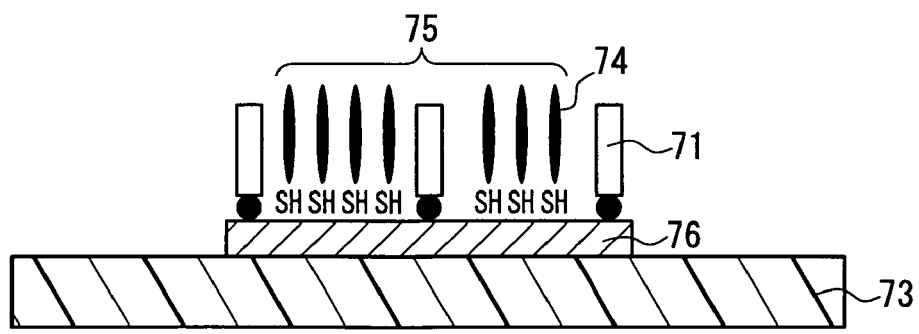
FIG. 7C is a schematic cross-sectional view showing a state after being exposed to an etching solution.
Figure 7D:
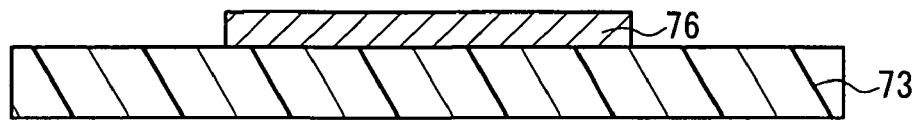
FIG. 7D is a schematic cross-sectional view showing a state after molecules adsorbed to the metal are removed.

(C) The Principle of the Metal Pattern Formation:

FIGS. 7A to 7D are schematic views explaining, on a molecular level, the manner of how a metal pattern is formed. FIG. 7A is a schematic view of a monomolecular film with a covering rate of less than 1 formed on a metal film. Molecules 71 having fluorinated alkyl chains are separated from one another, scattered, and adsorbed to a metal film 72. 73 denotes a substrate. FIG. 7B is a schematic view showing a state of a metal interface when a solution in which molecules 74 having mercapto groups or disulfide groups (the figure shows only the case of the solution containing the molecules having mercapto groups) are dissolved is dropped by the ink jet method on a predetermined region 75 covered with the foregoing monomolecular film. The molecules 74 in the solution penetrate the monomolecular film and are bound with the metal via the mercapto groups (SH) or disulfide groups (—SS—) (the figure shows only the case of the solution containing the molecules having mercapto groups). Aggregates of the molecules are resistant to an etching solution. Here, by removing a solvent by drying, under some conditions regarding the concentration of the molecules having mercapto groups or disulfide groups in the solution, the molecules are deposited indiscriminately on the monomolecular film, whereby a masking film is formed. Next, when the substrate is exposed to an etching solution, only portions a metal film 76 under regions where the solution is dropped remain, while the other portions of the metal are removed by etching, as shown in FIG. 7C, whereby a metal pattern is formed. FIG. 7D shows a state in which the masking film on the metal film 76 is removed.

(2) Metal Pattern Forming Method 2:

A preferable metal pattern forming method of the present invention is the above-described metal pattern forming method 1 further characterized in that the monomolecular film having fluorinated alkyl chains is formed by adsorption of either a molecule having a mercapto group or a disulfide group, or a silane coupling agent, to a metal.

(3) Metal Pattern Forming Method 3:

A preferable metal pattern forming method of the present invention is the above-described metal pattern forming method 1 further characterized in that the molecule having a mercapto group or a disulfide group is an alkane thiol ($CH_3(CH_2)_nSH$, where n is an integer), or an alkyl dithiol ($CH_3(CH_2)_qSS(CH_2)_rCH_3$, where q and r represent natural numbers, respectively). More preferably, n, q, and r are in a range of 7 to 17.

Since such a molecule is bound with a metal and forms a high-density monomolecular film, the film is highly resistant to an etching solution, and allows an accurate metal pattern to be formed.

(4) Metal Pattern Forming Method 4:

A preferable metal pattern forming method of the present invention is the above-described metal pattern forming method further characterized in that the metal is gold, silver, copper, platinum, gallium arsenide, or indium phosphide having a property of being bound with a mercapto group or a disulfide group, or a metal containing at least any of them.

(5) Metal Pattern Forming Method 5:

A preferable metal pattern forming method of the present invention is the above-described metal pattern forming method 1 further characterized in that the metal surface is treated with heat at 100° C. or above, or is exposed to ozone, so that a compound having a mercapto group or a disulfide group present on the metal surface is removed.

By the foregoing method, a metal pattern without a molecule having a mercapto group or a disulfide group remaining on the metal can be formed, as shown in FIG. 1E or FIG. 7D.

The monomolecular film having fluorinated alkyl chains used in the present invention is formed by adsorption of a molecule to a substrate, the molecule having both a functional group having a property of being bound with the substrate and fluorinated alkyl chains. More specifically, after a substrate is immersed in a solution in which a molecule to form a monomolecular film is dissolved for a predetermined time, the substrate is removed therefrom. In some cases, it is necessary that immediately after the substrate is removed from the solution, the substrate is washed with an organic solvent so that molecules adsorbed to the monomolecular film are removed. Examples of molecules to be used include the following four types:

a. Type 1 (molecule having a mercapto group): $CF_3(CF_2)_nZ(CH_2)_mSH$ (where n represents an integer of 0 to 12, m represents an integer of 0 to 5, and Z represents —O—CO—, —CO—O—, or NH—CO—. Z may be omitted). Examples of a solvent in which this type of a molecule is dissolved include alcohols (ethanol, propanol, butanol, etc.), ethers as derivatives of the foregoing alcohols (methoxy ethanol, ethoxy ethanol, ethylene glycol monoethyl ether, ethylene glycol monomethyl ether, etc.), and dichloromethane.

b. Type 2 (molecule having a disulfide group): $CF_3(CF_2)_nZ(CH_2)_mS—S(CH_2)_lY(CF_2)_{n'}CF_3$ (where n and n' represent integers of 0 to 12, respectively, m and l represent integers of 0 to 5, respectively, and Z and Y represent —O—CO—, —CO—O—, or NH—CO—. Z and Y may be omitted.) Examples of a solvent in which this type of a molecule is dissolved include alcohols (ethanol, propanol, butanol, etc.), ethers as derivatives of the foregoing alcohols (methoxy ethanol, ethoxy ethanol, ethylene glycol monoethyl ether, ethylene glycol monomethyl ether, etc.), and dichloromethane.

c. Type 3 (silane coupling agent having a chlorosilyl group): $CF_3(CF_2)_nC_2H_4\alpha_aSiCl_{3-a}$ (where α represents a methyl group, an ethyl group, or a propyl group, n represents an integer of 0 to 12, and a represents 0, 1, or 2. When a=2, two of α are present, which may have different structures.) This type of an organic molecule is highly reactive with active hydrogen, and a hydrolytic reaction of the same occurs quickly in the presence of moisture, whereby the chlorosilyl group (SiCl) becomes a silanol group (SiOH). The silanol groups cause a dehydration polymerization reaction therebetween, thereby forming a siloxane bond (Si—O—Si). Therefore, if molecules containing active hydrogen or water are present in a solution in which the foregoing molecules are dissolved, there is a possibility that the organic molecules alone form a polymer, thereby becoming insoluble. Accordingly, it is necessary to select a solvent that does not contain active hydrogen or moisture as a solvent for dissolving the foregoing type of an organic molecule. Examples of such a solvent include chloroform, alkanes having 6 to 16 carbon atoms (hexane, cyclohexane, heptane, octane, nonane, decane, undecane, dodecane, tridecane, tetradecane, pentadecane, hexadecane, etc.), xylene, toluene, and mixtures of any of the same.

d. Type 4 (silane coupling agent having an alkoxyl group): $CF_3(CF_2)_nC_2H_4\alpha_a Si(OR)_{3-a}$ (where $\alpha$ represents a methyl group, an ethyl group, or a propyl group, R represents a methyl group, an ethyl group, or a propyl group, n represents an integer of 0 to 12, and a represents 0, 1, or 2. When a=2, two of $\alpha$ are present, which may have different structures. When a=0 or 1, a plurality of R are present, which may have different structures.) Examples of a solvent for dissolving this type of an organic molecule include alcohols (ethanol, propanol, butanol, etc.), and ethers as derivatives of alcohols (methoxy ethanol, ethoxy ethanol, ethylene glycol monoethyl ether, ethylene glycol monomethyl ether, etc.). This type of an organic molecule reacts with active hydrogen (a hydroxy group, an amino group, a carboxyl group, etc.) on a substrate surface, thereby forming a siloxane bond and being adsorbed thereon. However, since the reactivity thereof is not as high as that of the organic molecule of the foregoing type 3, a small amount of water and an acidic catalyst desirably are added to a solvent for accelerating the reaction with the substrate.

To form a monomolecular film with a covering rate of less than 1, the concentration of the solution and the time of immersing the substrate are adjusted. Normally, by immersing the substrate for a predetermined time in a solution with a concentration of not more than 0.01 vol %, a monomolecular film with a covering rate of less than 1 is formed.

Examples of a molecule having a mercapto group to be jetted by the ink jet method include various types, among which alkane thiols ($CH_3(CH_2)_n SH$, where n is an integer) are preferable since they have a property of being bound with a metal, thereby forming a monomolecular film with a high density. Among these, n particularly preferably is in a range of 7 to 17, since as the molecular length is longer, the molecular film less allows an etching solution to permeate therethrough. Likewise, examples of a molecule having a disulfide group include various types, among which alkyl dithiols ($CH_3(CH_2)_q SS(CH_2)_r CH_3$, where q and r are natural numbers, respectively) are preferable since they form a monomolecular film with a high density. Like in the case of alkane thiols, q and r particularly preferably are in a range of 7 to 17, since as the molecular length is longer, the molecular film less allows an etching solution to permeate therethrough.

As the solvent for dissolving a molecule having a mercapto group or a disulfide group, any one of the following is used: alcohols (ethanol, propanol, butanol, etc.); ethers as derivatives of alcohols (methoxy ethanol, ethoxy ethanol, ethylene glycol monoethyl ether, ethylene glycol monomethyl ether, etc.); dichloromethane; and alkanes having 6 to 16 carbon atoms (hexane, cyclohexane, heptane, octane, nonane, decane, undecane, dodecane, tridecane, tetradecane, pentadecane, hexadecane, etc.). Normally, the concentration of such a molecule in a solution is adjusted to approximately 0.01 vol % to 1 vol %. When a pattern of a solution in which a molecule having a mercapto group or a disulfide group is dissolved is formed by the ink jet method on a metal substrate on which a monomolecular film having fluorinated alkyl chains is formed with a covering rate of less than 1, organic molecules in the pattern solution penetrate into the monomolecular film, and are adsorbed on the metal underneath. By removing the solvent by drying, a monomolecular film resistant to an etching solution is formed in a region where the pattern of the solution has been formed. In the case where the solution has a high concentration, the organic molecules are stacked indiscriminately on the monomolecular film.

As the metal with which a pattern is formed, a metal having a property of being bound with a mercapto group or a disulfide group is preferable. Presently, examples of the metal having a property of being bound with a mercapto group or a disulfide group include gold, silver, copper, platinum, gallium arsenide, and indium phosphide. Since the mechanism of the occurrence of a bond between a mercapto group or a disulfide group and a metal has not been clarified fully by the present time, there is a possibility that metals having a property of being bound with a mercapto group or a disulfide group are found other than the above-mentioned metals. Alloys containing gold, silver, copper, platinum, gallium arsenide, and indium phosphide also have a property of being bound with a mercapto group or a disulfide group, and hence, these alloys can be used as the pattern forming material.

After a pattern of the solution in which a molecule having a mercapto group or a disulfide group is dissolved is drawn on a metal film surface by the ink jet method and the metal film is exposed to an etching solution so that a metal pattern is formed, a monomolecular film having fluorinated alkyl chains, and a molecule having a mercapto group or a disulfide group remain on the metal pattern, being adsorbed thereto. These molecules have to be removed in some cases, but not removed in other cases.

For instance, in the case of a metal pattern formed on a printed circuit board, a step of removing these molecules is unnecessary. This is because the process for mounting electronic components such as resistors, capacitors, ICs, etc. on the metal pattern thus formed is carried out using a solder molten at 200° C. or above, and at this temperature the molecules are removed completely. Further, since the metal pattern formed according to the present invention has water repellency, it has effects that it is less prone to being soiled, and that soils adhering thereto can be removed easily. In the case where an electronic component is mounted on a metal film pattern, if the metal film is soiled, a problem tends to occur in the mounting process. Therefore, by using the water-repellent metal pattern of the present invention, it is possible to mount an electronic component with high reliability. Still further, in the case where a pattern of a gate electrode of a transistor is formed according to the present invention, it is necessary to form an insulation film further thereon, and therefore, the foregoing molecules have to be removed. The molecule having a mercapto group or a disulfide group on a metal can be removed by heating at 100° C. or above so that it volatilizes therefrom. The temperature at the heating may be at a level of a boiling point of the molecule used. Alternatively, the molecule is burnt when being exposed to an ozone atmosphere, and hence, it can be removed from the metal even at room temperature.

Figure 8:
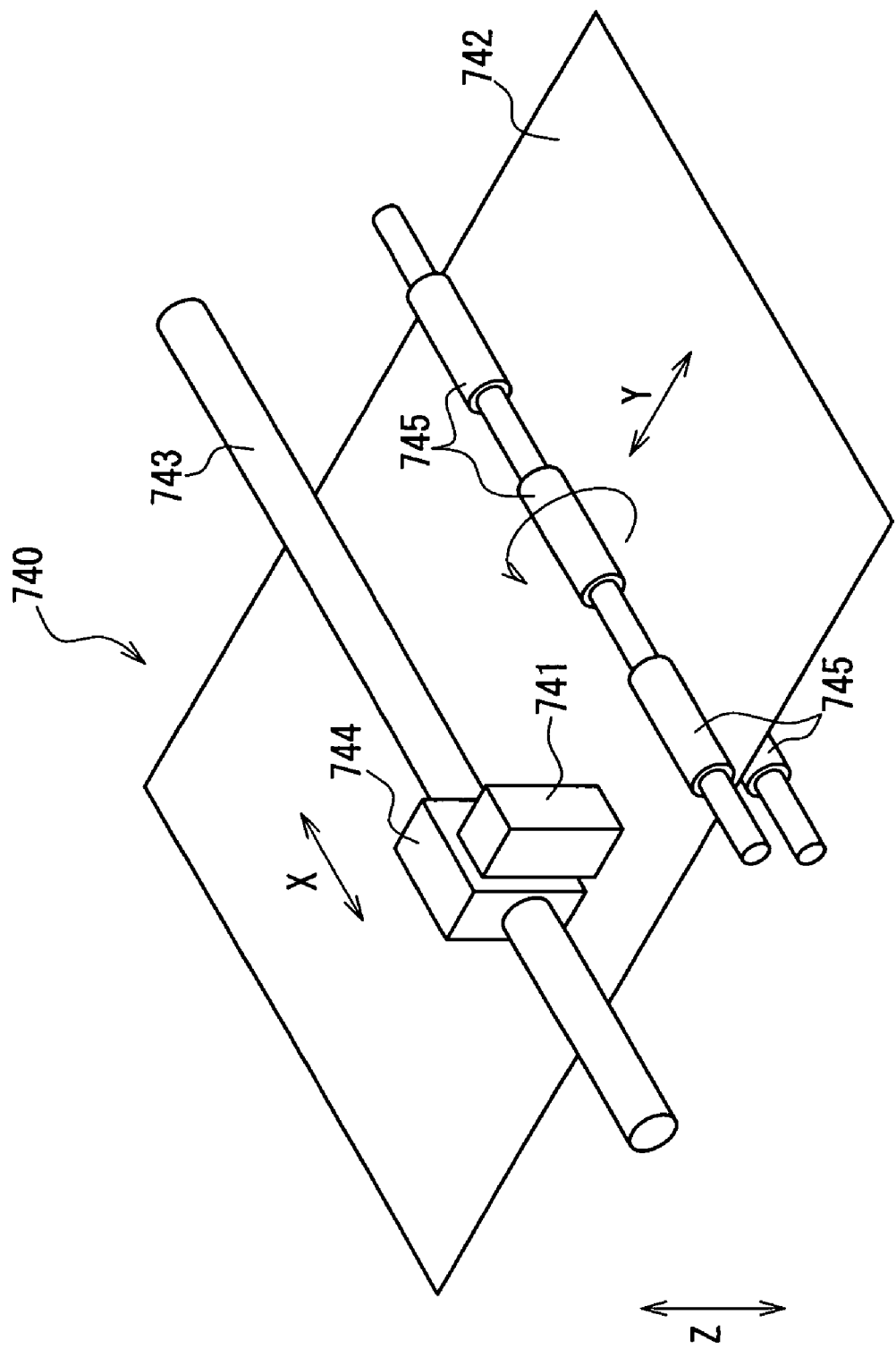
FIG. 8 is a schematic perspective view showing an overall configuration of an ink jet printer used in an example of the present invention.

Next, an ink jet printer used in examples of the present invention is described, with reference to schematic views of the same shown in FIGS. 8 and 9. FIG. 8 is a schematic view showing an overall configuration of an ink jet printer 740. The ink jet printer shown in the foregoing drawing is provided with an ink jet head 741 that performs recording by utilizing a piezoelectric effect of a piezoelectric element, and accordingly, the ink jet printer performs recording with respect to a recording medium by causing an ink drop jetted from the ink jet head to adhere on a recording medium 742 such as paper. The ink jet head is mounted on a carriage 744 that is disposed so as to move in a main scanning direction X, and the ink jet head makes a reciprocating motion in the main scanning direction X when the carriage makes a reciprocating motion along a carriage shaft 743. Further, the ink jet printer is provided with a plurality of rollers (moving means) 745 that cause a recording medium to move relatively in a sub-scanning direction Y orthogonal to a direction (direction X) of a width of the ink jet head. The ink jet head is composed of a nozzle plate having nozzle holes for jetting an ink therethrough, a driving portion for causing an ink to be jetted through the nozzle, and a portion for feeding the ink to the nozzle.

Figure 9A:
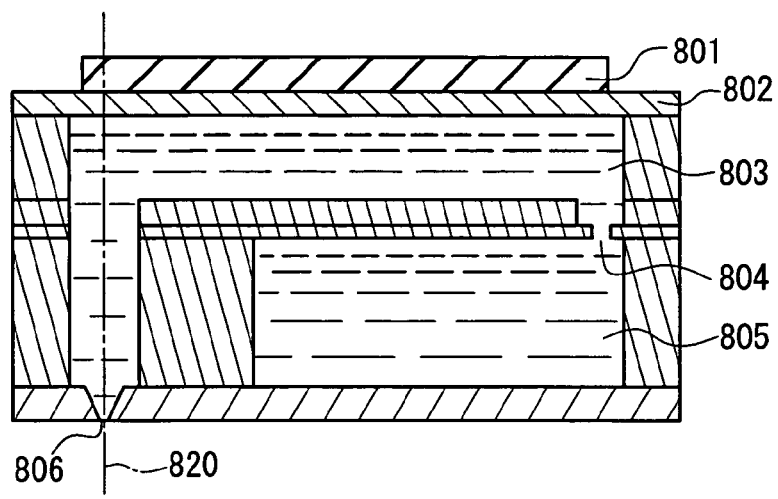
FIG. 9A is a schematic cross-sectional view showing a vicinity of a nozzle hole of an ink jet head.
Figure 9B:
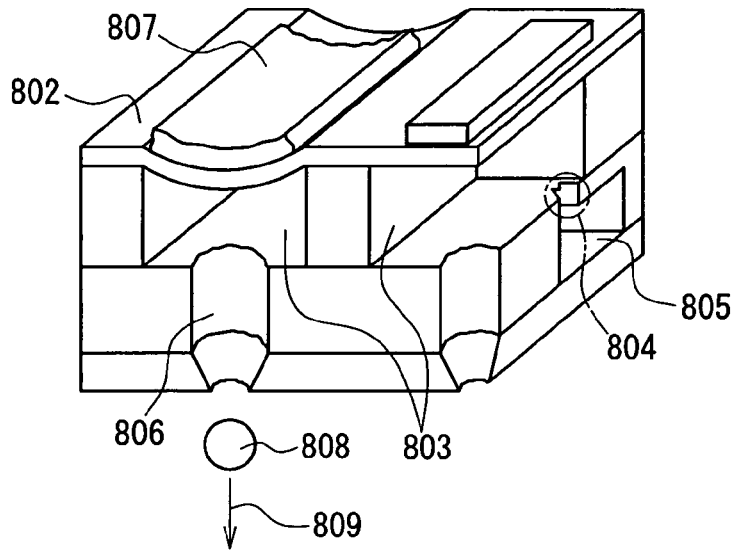
FIG. 9B is a cross-sectional view taken along a plane that passes an alternate long and short dashed line shown in FIG. 9A and is perpendicular to a face of the sheet carrying the drawing.
Figure 9C:
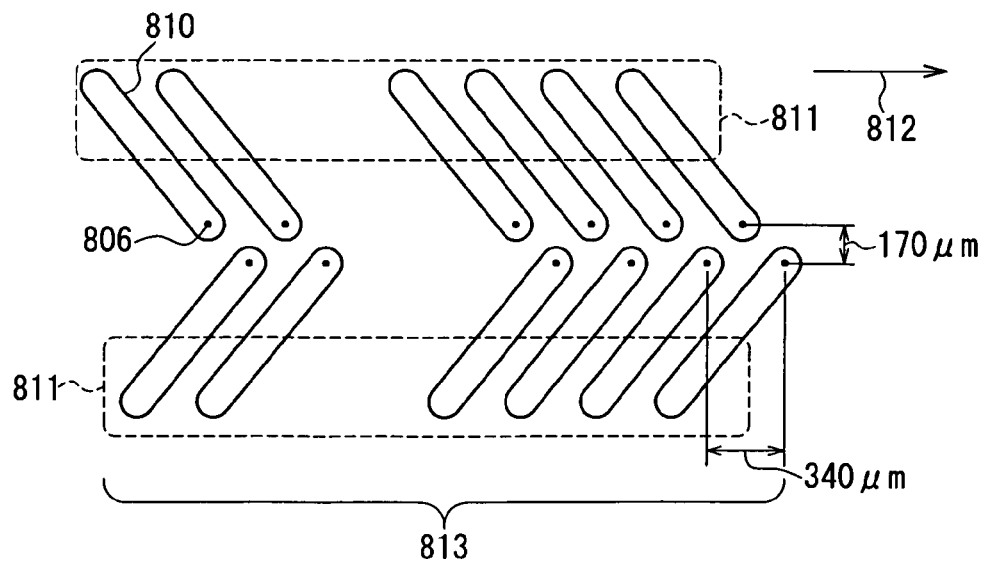
FIG. 9C is a plan view of the ink jet head viewed from above the nozzle hole shown in FIG. 9A.
Figure 11A:
FIG. 11A is a schematic cross-sectional view showing a state in which a liquid jetted by the ink jet method spreads on a substrate in a conventional example, in which the liquid jetted by the ink jet method is coming to a surface of the substrate.
Figure 11B:
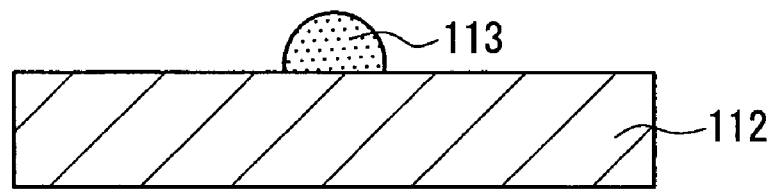
FIG. 11B is a schematic cross-sectional view showing a state immediately after the liquid is brought into contact with the surface of the substrate.
Figure 11C:
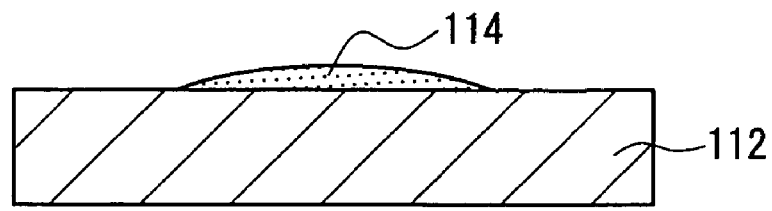
FIG. 11C is a schematic cross-sectional view showing a state in which the liquid spreads on the surface of the substrate.
Figure 12C:
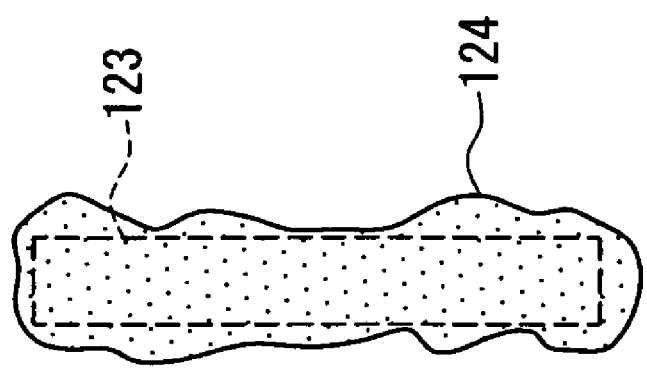
FIG. 12C is a schematic plan view showing a solution pattern formed in the case where the jetted solution spreads on the substrate.
Figure 12B:
FIG. 12B is a schematic plan view showing a solution pattern formed in the case where the jetted solution does not spread on a substrate.
Figure 12A:
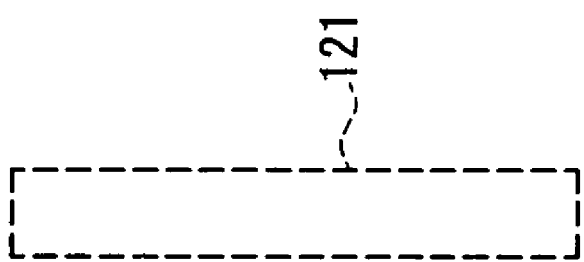
FIG. 12A is a schematic view showing a pattern of the solution formed by a conventional usual ink jet method, which is a schematic plan view showing a region to which the solution is jetted by the ink jet method.

FIGS. 9A to 9C are schematic views showing a configuration of a portion of the ink jet printer through which an ink is jetted. FIG. 9A is a cross-sectional view showing the nozzle hole 806 and the vicinity thereof. The nozzle hole is connected to a pressure chamber 803, and the pressure chamber has a vibration plate 802 and a piezoelectric element 801 in its upper portion. The pressure chamber is filled with an ink, and the ink flows through an ink flowing path 805 and is fed through an ink feeding hole 804. Upon application of a voltage to the piezoelectric thin film, the piezoelectric thin film and the vibration plate are warped, which increases the pressure in the pressure chamber, thereby causing the ink to be jetted through the nozzle hole. Water repellency is imparted to a surface of the nozzle plate so that the ink is jetted through the nozzle hole in a set direction. FIG. 9B is a stereographic drawing of the configuration shown in FIG. 9A, the drawing being taken along a plane that passes through a long and short dashed line 820 shown in FIG. 9A and is perpendicular to a surface of the sheet carrying the drawing. Here, only a configuration in the vicinity of two nozzle holes is shown, but the actual overall configuration is such that a multiplicity of portions, each of which is configured as such, are aligned in a row. The drawing shows a state in which the piezoelectric element and the vibration plate on the left are warped, thereby causing an ink 808 to be jetted through the nozzle hole. 807 denotes a piezoelectric element deformed by the voltage application and 809 denotes a direction in which the ink flies.

It should be noted that as seen in the drawing, one pressure chamber and one piezoelectric element are allocated to each nozzle hole, but the ink flowing path for feeding the ink is shared for the plurality of nozzle holes, and the ink is fed through an ink feeding path provided in each pressure chamber from the flowing path (in the drawing, an ink feeding hole of the pressure chamber on the left side is not seen behind a wall separating the two pressure chambers). FIG. 9C is a plan view seen from above the nozzle plate. In this example, 100 nozzle holes are arrayed, at intervals of 340 µm, horizontally in each of two vertically arrayed rows. These rows, each of which has 100 nozzles, are arranged vertically with an interval of 170 µm therebetween. In the drawing, each line 810 encircling each nozzle indicates a shape of each piezoelectric element disposed behind the nozzle plate, and each broken line 811 indicates a shape of the ink flowing path. Since an ink is fed from one ink flowing path to the 100 nozzle holes thus aligned horizontally, an ink of the same color is jetted from the 100 nozzle holes thus aligned horizontally. 812 denotes a sheet transporting direction, and 813 denotes a state in which a plurality of nozzles are arranged in two rows.

In the ink jet head of examples of the present invention, the vibration plate 802 was copper formed to be 3 µm thick, and the piezoelectric element 801 was lead zirconate titanate (PZT) formed to be 3 µm thick. PZT was formed by vacuum sputtering, and was aligned in the (001) direction, i.e., in a direction perpendicular to the film. Further, the nozzle holes had a diameter of 20 µm, and were formed by an electrodischarge method. The number of nozzles was 400 in total, and four rows, each having 100 nozzle holes aligned at intervals of 340 µm, were arrayed at intervals of 170 µm.

In the examples, a predetermined liquid was jetted instead of an ink. 100 nozzle holes in one row were used. The jetting of the liquid was carried out by applying a voltage with a frequency of 10 KHz and an amplitude of 20 V to piezoelectric elements. The drawing was carried out by relatively moving the head and a printing material as required.

The following describes examples, so as to make the present invention understood. The present invention however is not limited to the examples thus described.

EXAMPLE 1

(1) Preparation of Substrate:

A surface of a 4-inch silicon wafer was exposed to an ozone atmosphere at 110° C. so that organic matters on the surface were removed, and subsequently a 300 nm-thick copper film was formed on the surface by electron-beam evaporation.

(2) Formation of a Monomolecular Film Having Fluorinated Alkyl Chains:

An ethanol solution in which $CF_3(CF_2)_7C_2H_4SH$ was dissolved at a concentration of $10^{-4}$ vol % was prepared. The silicon wafer with the copper film formed thereon was immersed in the foregoing solution for a predetermined time, and was removed therefrom. The silicon wafer then was washed with pure ethanol, and subsequently was washed with running pure water. The water repellency of a monomolecular film thus formed was evaluated by measuring a static contact angle of the film with respect to pure water.

(3) Preparation of Liquid to be Jetted:

An ethanol solution in which hexadecane thiol $(CH_3(CH_2)_{15}SH)$ was dissolved at a concentration of 0.1 vol % was prepared.

(4) Formation of Metal Pattern:

The hexadecane thiol solution was loaded in the ink jet head, and the ink jet head was disposed so that a distance between the nozzle plate and the silicon wafer was 0.5 mm. The solution was jetted in accordance with the movement of the ink jet head, so that the solution is disposed in a region with a width of 100 µm and a length of 10 mm on the silicon wafer. For comparison, the drawing was carried out with the solution on a copper film on which the monomolecular film of $CF_3(CF_2)_7C_2H_4SH$ was not formed.

Thereafter, the silicon substrate was dried naturally at room temperature for 5 minutes, and it was immersed in a 5 wt % aqueous solution of iron chloride ($FeCl_3$) as an etching solution for copper so that a metal pattern was formed. Subsequently it was washed with pure water.

(5) Evaluation of Pattern:

In an ideal state in which the jetted solution does not spread, a copper line pattern with a width of 100 µm and a length of 10 mm should be formed. Then, to determine deviations from the ideal values, the maximum width and the minimum width of the copper line of each sample thus formed were determined by optical microscope observation.

(6) Result:

The result is shown in Table 1. In the case where the solution was jetted on the copper film without a monomolecular film formed thereon, the pattern had the maximum line width of 5000 µm, which shows that it was impossible to form an accurate copper pattern. It can be supposed that since the non-treated copper film surface was hydrophilic as shown by the static contact angle with respect to pure water, the liquid jetted thereto spread on the copper surface and did not form an accurate pattern.

In the case where the solution was jetted onto the copper films on which the monomolecular films were formed by immersing the substrates in the $CF_3(CF_2)_7C_2H_4SH$ solution for 1 minute to 30 minutes, patterns were formed incomparably accurately, as compared with that of the non-treated copper. The immersion for 1 minute resulted in that the jetted solution spread, since only insufficient water repellency was imparted thereto as compared with the case of the immersion for 30 minutes, and therefore, the pattern obtained had a widened line width as compared with that obtained as a result of the immersion for 30 minutes.

As a result of the immersion for 60 minutes, a maximum line width of 103 µm was obtained, which was close to a value of the ideal pattern, but copper remained partially in a region onto which the solution was not jetted, not being removed by etching. It is supposed that this is because the monomolecular film formed on the copper film had a covering rate close to 1, and films resistant to the etching solution were formed in part on the copper film surface.

Thus, in the present example, the most accurate metal pattern was formed in the case where the substrate was immersed in the $CF_3(CF_2)_7C_2H_4SH$ solution for 30 minutes.

(7) Removal of Molecules Remaining on Metal Pattern:

$CH_3(CH_2)_{15}SH$ and $CF_3(CF_2)_7C_2H_4SH$ were adsorbed onto the metal patterns formed by the present method. Therefore, the molecules were removed by either one of the following two methods:

First method: Leaving the substrate having the pattern formed thereon in an oven at 150° C. for 2 hours.

Second method: Leaving the substrate having the pattern formed thereon in an ozone atmosphere for 15 minutes. For this ozone treatment, an UV ozone asher (manufactured by SAMCO Inc., MODEL UV-1) was used.

Whether or not the molecules adsorbed on the metal pattern were removed completely was determined by analyzing elements by the X-ray microanalysis method.

As a result, only copper element was detected from the surfaces of the metal patterns from which adsorbed molecules were removed by the above-described methods, and elements of C, F, and S originating from the adsorbed molecules were not detected. Therefore, it was confirmed that the adsorbed molecules on the metal patterns were removed completely by the foregoing methods.

It should be noted that since a monomolecular film having fluorinated alkyl chains was formed using molecules having a thiol group in the present example, the monomolecular film strongly adhered to copper, and therefore the film was not peeled off in the solution drawing by the ink jet method and repelled the solution excellently, thereby allowing an accurate pattern to be formed.

(8) Evaluation of Soil-Resistant Property:

A copper pattern of an example of the present invention and a copper pattern formed by a usual photolithography method were compared regarding the soil-resistant property. As the copper pattern of the example of the present invention, a copper pattern formed by the above-described method including the immersion of a substrate in the $CF_3(CF_2)_7C_2H_4SH$ solution for 30 minutes. $CH_3(CH_2)_{15}SH$ and $CF_3(CF_2)_7C_2H_4SH$ on the copper pattern were not removed. The copper pattern formation by the photolithography method was carried out in the following manner. On a copper film of the same type as that of the present example, a pattern of a positive-type resist was formed, and thereafter, the copper film was subjected to etching so that a copper pattern was formed, and the resist pattern was removed.

Next, the copper pattern of the present example and the copper pattern formed by the photolithography method were left to stand in an indoor environment for one month, and were washed with water lightly. Then, 50 resistors were mounted on each of them by soldering, and resistor peeling tests were carried out. The mounting of the resistors was carried out by using a lead-free solder (manufactured by Matsuo Handa Co, Ltd., 2001A) molten with a soldering iron with a temperature of 300° C. to cause the resistors to adhere to the copper patterns. The amount of solder used for adhesion was uniform.

The result of the peeling tests show that the resistors peeled off from the substrate along with copper in the case of the copper pattern of the present example, whereas only the resistors were peeled off from copper in the case of the copper pattern produced by the photolithography method. This result indicates that the adhesion of the resistors to copper in the case of the copper pattern of the present example was stronger than that in the case of the conventional copper pattern.

The following can be supposed from the foregoing result. When a copper pattern was left in an indoor environment, soils such as organic substances floating in the indoor environment adhered to the copper surface. Since $CF_3(CF_2)_7C_2H_4SH$ and $CH_3(CH_2)_{15}SH$ molecules were present on the surface of the copper pattern of the present example and therefore were water-repellent, soils adhering to the surface were removed by washing with water, and the soldering of the resistors was not affected by soils. In contrast, soils were not removed from the copper pattern produced by the photolithography method even when being washed with water, and the soils caused the adhesion between the resistors and copper achieved by soldering to deteriorate. Further, in the case of the copper pattern produced by the photolithography method, an oxide film was formed on its surface while it was being left to stand, and the oxide film became another factor that deteriorated the adhesion of the copper pattern with the solder. On the other hand, in the case of the copper pattern of the present invention, monomolecular films of $CF_3(CF_2)_7C_2H_4SH$ and $CH_3(CH_2)_{15}SH$ inhibited the oxidation of the surface of copper (anticorrosive effect), and therefore, the solder was bound therewith strongly even after the pattern was being left to stand for a long time.

What is described above can be concluded as follows: the copper pattern of the present example has a higher soil-resistant property as compared with the pattern produced by the conventional photolithography method.

TABLE 1

| Time of immersion in $CF_3(CF_2)_7C_2H_4SH$ solution (min) | Static contact angle of copper surface to pure water after formation of $CF_3(CF_2)_7C_2H_4SH$ monomolecular film (deg) | Minimum line width (μm) | Maximum line width (μm) |
|---|---|---|---|
| 0 [1] | 5 or below | 1000 | 5000 |
| 1 | 49 | 150 | 200 |
| 10 | 60 | 100 | 110 |
| 30 | 98 | 98 | 105 |
| 60 | 110 | 99 [2] | 103 [2] |

[1] Comparative sample without a monomolecular film
[2] Copper remains partially in a region in which the solution was not applied, but does not lead to a problem practically.

EXAMPLE 2

Copper patterning was carried out in the same manner as that of Example 1 except that each monomolecular film having fluorinated alkyl chains was formed by the following method.

(1) Formation of Monomolecular Film Having Fluorinated Alkyl Chains:

After a silicon wafer was immersed for a predetermined time in a solution of a mixture of n-hexadecane and chloroform (volume ratio: 4:1) in which $CF_3(CF_2)_7C_2H_4SiCl_3$ was dissolved at a concentration of $10^{-4}$ vol %, the silicon wafer was washed with chloroform. The foregoing process was carried out in a glove box filled with dried nitrogen. Next, the silicon wafer was removed from the glove box, and was washed with running water for approximately 5 minutes.

(2) Result:

The result is shown in Table 2 below. With immersion for 1 to 20 minutes, copper patterns were formed in the same manner as Example 1.

As a result of the immersion for 60 minutes, a maximum line width of 102 μm was obtained, which was close to a value of the ideal pattern, but copper remained partially in a region onto which the solution was not jetted, not being removed by etching. It is supposed that this is because the monomolecular film had a covering rate close to 1, and films resistant to the etching solution were formed in part on the metal surface.

Thus, in the present example, the most accurate metal pattern was formed in the case where the substrate was immersed in the $CF_3(CF_2)_7C_2H_4SiCl_3$ solution for 20 minutes.

(3) Removal of Molecules Remaining on Metal Pattern:

$CH_3(CH_2)_{15}SH$ and $CF_3(CF_2)_7C_2H_4SiCl_3$ were adsorbed onto the metal pattern formed by the present method. Therefore, the adsorbed molecules were removed by leaving the substrate having the pattern formed thereon in an ozone atmosphere at 110° C. for 15 minutes. For this ozone treatment, an UV ozone asher (SAMCO Inc., MODEL UV-1) was used.

Whether or not the adsorbed molecules were removed completely was determined by analyzing elements by the X-ray microanalysis method.

As a result, only copper element was detected from the surfaces of the metal patterns from which adsorbed molecules were removed, and elements of C, F, and S originating from the adsorbed molecules were not detected. Therefore, it was confirmed that the adsorbed molecules on the metal patterns were removed completely by the foregoing method.

It should be noted that since a monomolecular film having fluorinated alkyl chains was formed using molecules having a chlorosilyl group in the present example, the monomolecular film strongly adhered to copper, and therefore the film was not peeled off in the solution drawing by the ink jet method and repelled the solution excellently, thereby allowing an accurate pattern to be formed.

TABLE 2

| Time of immersion in $CF_3(CF_2)_7C_2H_4SiCl_3$ solution (min) | Static contact angle of copper surface to pure water after formation of $CF_3(CF_2)_7C_2H_4SiCl_3$ monomolecular film (deg) | Minimum line width (μm) | Maximum line width (μm) |
|---|---|---|---|
| 1 | 60 | 100 | 110 |
| 5 | 80 | 99 | 103 |
| 20 | 98 | 98 | 105 |
| 60 | 110 | 98 [1] | 102 [1] |

[1] Copper remains partially in a region in which the solution was not applied, but does not leads to a problem practically.

EXAMPLE 3

Copper patterning was carried out in the same manner as that of Example 1 except that each monomolecular film having fluorinated alkyl chains was formed by the following method.

(1) Formation of Monomolecular Film Having Fluorinated Alkyl Chains:

After a silicon wafer was immersed for a predetermined time in an ethanol solution in which 0.1 vol % of $CF_3(CF_2)_7C_2H_4Si(OCH_3)_3$, 1 vol % of water, and 0.01 vol % of hydrochloric acid were dissolved, the silicon wafer was washed with ethanol. Thereafter, the silicon wafer was washed with running pure water.

(2) Result:

The result is shown in Table 3 below. With immersion for 30 to 120 minutes, copper patterns were formed in the same manner as Example 1.

As a result of the immersion for 240 minutes, a maximum line width of 102 µm was obtained, which was close to a value of the ideal pattern, but copper remained partially in a region onto which the solution was not jetted, not being removed by etching. It is supposed that this is because the monomolecular film formed on the copper film has a covering rate close to 1, and films resistant to the etching solution were formed in part on the metal surface.

Thus, in the present example, the most accurate metal pattern was formed in the case where the substrate was immersed in the $CF_3(CF_2)_7C_2H_4Si(OCH_3)_3$ solution for 120 minutes.

(3) Removal of Molecules Remaining on Metal Pattern:

$CH_3(CH_2)_{15}SH$ and $CF_3(CF_2)_7C_2H_4Si(OCH_3)_3$ were adsorbed onto the metal pattern formed by the present method. Therefore, the adsorbed molecules were removed by leaving the substrate having the pattern formed thereon in an ozone atmosphere at 110° C. for 15 minutes. For this treatment, an UV ozone asher (SAMCO Inc., MODEL UV-1) was used.

Whether or not the adsorbed molecules were removed from the metal surfaces completely was determined by analyzing elements by the X-ray microanalysis method.

As a result, only copper element was detected from the surfaces of the metal patterns from which adsorbed molecules were removed, and elements of C, F, and S originating from the adsorbed molecules were not detected. Therefore, it was confirmed that the adsorbed molecules on the metal patterns were removed completely by the foregoing method.

It should be noted that in the case where the $CF_3(CF_2)_7C_2H_4Si(OCH_3)_3$ solution was used, the substrate immersion time necessary for imparting the same water repellency to the copper film surface was longer as compared with Examples 1 and 2. This is because the bonding reactivity of the methoxyl group ($OCH_3$) with a metal is lower as compared with the mercapto group (SH) and the chlorosilyl group ($SiCl_3$). A water-repellent degree of a metal can be changed by controlling the time of immersion of a substrate in a solution in which such a molecule is dissolved. In the case where a molecule with a high reactivity is used, the water repellency of the substrate significantly varies even with a small change in the immersion time, and accordingly, it is difficult to impart a desired water repellency to the substrate with a high degree of reproducibility. On the other hand, in the case where the molecule having an alkoxyl group of the present example is used, since the alkoxyl group has a low reactivity as compared with the mercapto group and the chlorosilyl group, a small change in the immersion time does not cause the water repellency imparted to the substrate to vary substantially, and it is possible to control the water repellency of the substrate with a high degree of reproducibility.

EXAMPLE 4

Copper patterns were formed in the same manner as that in Example 1 except that $CH_3(CH_2)_{15}SS(CH_2)_{15}SS(CH_2)_{15}CH_3$ was used as a liquid to be jetted, in place of $CH_3(CH_2)_{15}SH$. As a result, metal patterns were formed in the same manner as that in the case where $CH_3(CH_2)_{15}SH$ was used. The minimum line widths and the maximum line widths of the copper patterns thus formed were substantially identical to those in the case where $CH_3(CH_2)_{15}SH$ was used.

EXAMPLE 5

Copper patterns were formed in the same manner as that in Example 1 except that for the formation of a monomolecular film having fluorinated alkyl chains, $CF_3(CF_2)_7C_2H_4SSC_2H_4(CF_2)_7CF_3$ was used in place of $CF_3(CF_2)_7C_2H_4SH$. As a result, metal patterns were formed in the same manner as that in the case where $CF_3(CF_2)_7C_2H_4SH$ was used. The minimum line widths and the maximum line widths of the copper patterns thus formed were substantially identical to those in the case where $CF_3(CF_2)_7C_2H_4SH$ was used.

EXAMPLE 6

Metal patterns were formed in the same manner as that in Example 1 except that as the metal thin films, gold, silver, and platinum thin films were used in place of the copper thin film. These films were formed by electron-beam evaporation. The thickness thereof was set to 300 nm. Different etching solutions were used for the foregoing metals, respectively. As the etching solution for gold, an aqueous solution of 1 M of KOH and 0.1 M of KCN saturated with oxygen gas was used. As the etching solution for silver, an aqueous solution of 0.01 M of $K_3Fe(CN)_6$ and 0.1 M of $K_2S_2O_3$ was used. As the etching solution for platinum, a solution of a mixture of 36 wt % of HCl and 30 wt % of hydrogen peroxide (volume ratio: 3:1) was used.

As a result, metal patterns were formed in the same manner as that of Examples. The minimum line widths and the maximum line widths of the metal patterns thus formed were substantially identical to those in Example 1.

EXAMPLE 7

Metal patterns were formed in the same manner as that in Example 2 except that as the metal thin films, a film of an alloy of aluminum and indium phosphide (element ratio: 8:2) and a film of an alloy of aluminum and gallium arsenide (element ratio: 8:1) were used. The alloy films were formed by vacuum sputtering. The film of the alloy of aluminum and indium phosphide was formed in the following manner: collision was

TABLE 3

| Time of immersion in $CF_3(CF_2)_7C_2H_4Si(OCH_3)_3$ solution (min) | Static contact angle of copper surface to pure water after formation of $CF_3(CF_2)_7C_2H_4 Si(OCH_3)_3$ monomolecular film (deg) | Minimum line width (µm) | Maximum line width (µm) |
|---|---|---|---|
| 30 | 60 | 100 | 110 |
| 60 | 80 | 99 | 105 |
| 120 | 98 | 98 | 103 |
| 240 | 110 | 99 [1] | 102 [1] |

[1] Copper remains partially in a region in which the solution was not applied, but does not lead to a problem practically.

caused by RF plasma simultaneously against a target of aluminum and against a target of indium phosphide so that an alloy film was formed on a wafer. The composition of the alloy film was adjusted by controlling the sputtering conditions for each target. Likewise, the film of the alloy of aluminum and gallium arsenide was formed by using a target of aluminum and a target of gallium arsenide.

As the etching solution for these alloy films, an aqueous solution of a mixture of 40 wt % of iron (II) chloride and 4 vol % of hydrochloric acid was used.

The result is shown in Tables 4 and 5. The foregoing two alloys exhibited identical tendencies regarding the relationship between the time of immersion in the $CF_3(CF_2)_7C_2H_4SiCl_3$ solution and the line width of the metal pattern. Accurate patterns were formed in the case where the immersion time was in a range of 1 minute to 20 minutes.

The result of evaluation of the pattern of the alloy of aluminum and indium phosphide is shown in Table 4, and the result of evaluation of the pattern of the alloy of aluminum and gallium arsenide is shown in Table 5.

TABLE 4

| Time of immersion in $CF_3(CF_2)_7C_2H_4SiCl_3$ solution (min) | Static contact angle of aluminum/indium phosphide alloy surface to pure water after formation of $CF_3(CF_2)7C_2H_4 SiCl_3$ monomolecular film (deg) | Minimum line width (μm) | Maximum line width (μm) |
| --- | --- | --- | --- |
| 1 | 60 | 115 | 140 |
| 5 | 80 | 110 | 120 |
| 20 | 98 | 98 | 110 |

TABLE 5

| Time of immersion in $CF_3(CF_2)_7C_2H_4SiCl_3$ solution (min) | Static contact angle of aluminum/gallium arsenide alloy surface to pure water after formation of $CF_3(CF_2)_7C_2H_4 SiCl_3$ monomolecular film (deg) | Minimum line width (μm) | Maximum line width (μm) |
| --- | --- | --- | --- |
| 1 | 60 | 110 | 130 |
| 5 | 80 | 110 | 120 |
| 20 | 98 | 90 | 108 |

EXAMPLE 8

Metal patterns were formed in the same manner as that in Example 1 except that polyethylene terephthalate resin substrates with a thickness of 1 mm each were used in place of the silicon wafers. Before copper thin films were formed on the substrates, the substrates were subjected to ultrasonic washing with a neutral detergent, washing with running pure water, and ultrasonic washing in ethanol, respectively, followed by drying at 50° C. for 30 minutes.

As a result, metal patterns were formed in the same manner as that of Examples. The minimum line widths and the maximum line widths of the metal patterns thus formed were substantially identical to those in Example 1.

Industrial Applicability

The metal pattern forming method of the present invention does not require a costly photomask, and therefore is advantageous in the case of small-volume manufacturing of various types of printed circuit boards. Besides, since the method of the present invention allows the distance that the ink jet head moves to be increased infinitely in principle, the method is advantageous for use in forming metal wiring as well as gate electrodes, source electrodes, and drain electrodes as driving elements for a liquid crystal display, an electroluminescence-type large-scale display, a plasma display.

Further, since it is possible to cause the ink jet head to jet a liquid while moving three-dimensionally, the use of the method of the present invention allows a metal pattern to be formed on a curved surface. In the case of a small-size electronic apparatus such as a cellular phone, it is necessary to use a vacant space in the apparatus efficiently, and hence, it is necessary to form a circuit on a surface of a component shaped so as to be fit in a vacant space in the apparatus. Therefore, the metal pattern forming method of the present invention is very useful in the manufacture of a small-size apparatus such as a cellular phone.

Still further, since the metal pattern of the present invention has a water-repellent surface, it has an excellent soil-resistant property. Still further, by utilizing this water repellency, the pattern can be used as a pattern for preventing blurring in an electronic device formation utilizing the ink jet method. More specifically, when a solution containing a semiconductor material, an insulation material, etc., is jetted by the ink jet method onto a region enclosed by a metal pattern formed by the present invention, the jetted solution does not spread out of the metal pattern due to the water repellent effect, whereby a pattern of the foregoing material can be formed with high accuracy.

The invention claimed is:

1. A metal pattern formed on a surface of a substrate by etching, the metal pattern comprising:
    a monomolecular film containing fluorinated alkyl chains $(CF_3(CF_2)_n—$, where n represents an integer), formed on a surface of a metal film composing the metal pattern; and
    a masking film formed by penetration of a molecule having a mercapto group (—SH) or a disulfide (—SS—) group into interstices between molecules composing the monomolecular film.

2. The metal pattern according to claim 1, wherein the monomolecular film is formed by adsorption of a silane coupling agent to the surface of the metal film.

3. The metal pattern according to claim 1, wherein the monomolecular film is formed by adsorption, or by binding by covalent bond, of a molecule to the surface of the metal film, the molecule having an alkoxysilyl group, a halogenated silyl group, a mercapto group, or a disulfide group (—SS—).

4. The metal pattern according to claim 1, wherein
the molecule having a mercapto group or a disulfide group that composes the masking film is an alkane thiol ($CH_3(CH_2)_nSH$, where n is an integer), or an alkyl dithiol ($CH_3(CH_2)_qSS(CH_2)_rCH_3$, where q and r are natural numbers, respectively).

5. The metal pattern according to claim 1, where
the metal pattern has a liquid-dropped trace.

6. The metal pattern according to claim 1, wherein
the metal film is formed with at least one metal selected from gold, silver, copper, platinum, gallium arsenide, and indium phosphide.

7. The metal pattern according to claim 1, wherein
the masking film has water-repellent and soil-resistant properties.

8. The metal pattern according to claim 1, wherein
the substrate is made of a resin.

9. The metal pattern according to claim 1, wherein
the metal pattern is a wiring pattern or a decoration-use pattern.

10. A metal pattern producing method for forming a metal pattern on a surface of a substrate by etching, the method comprising the steps of:
forming a monomolecular film containing fluorinated alkyl chains ($CF_3(CF_2)_n$—, where n represents an integer) on a surface of a metal film;
forming a masking film by applying a solution in which a molecule having a mercapto group (—SH) or a disulfide (—SS—) group is dissolved over a surface of the monomolecular film so that the molecule having a mercapto group (—SH) or a disulfide (—SS—) group penetrates in interstices between molecules composing the monomolecular film; and
etching the metal film by exposing the surface of the metal film to an etching solution so that a portion of the metal film in a region not covered with the masking film is removed so that the metal pattern is formed.

11. The metal pattern producing method according to claim 10, wherein
the monomolecular film is formed by adsorption of a silane coupling agent to the surface of the metal film.

12. The metal pattern producing method according to claim 10, wherein
the monomolecular film is formed by adsorption, or by binding by covalent bond, of a molecule to the surface of the metal film, the molecule having an alkoxysilyl group, a halogenated silyl group, a mercapto group, or a disulfide group (—SS—).

13. The metal pattern producing method according to claim 10, wherein
the molecule having a mercapto group or a disulfide group that composes the masking film is an alkane thiol ($CH_3(CH_2)_nSH$, where n is an integer), or an alkyl dithiol ($CH_3(CH_2)_qSS(CH_2)_rCH_3$, where q and r are natural numbers, respectively).

14. The metal pattern producing method according to claim 10, wherein
the masking film is formed by jetting a solution by the ink jet method.

15. The metal pattern producing method according to claim 10, wherein
the metal film is formed with at least one metal selected from gold, silver, copper, platinum, gallium arsenide, and indium phosphide.

16. The metal pattern producing method according to claim 10, wherein
after the metal pattern is formed, the surface of the metal film is subjected to a heat treatment at a temperature of 100° C. or above, or is exposed to ozone, so that molecules adsorbed to the surface of the metal film are removed.

17. The metal pattern producing method according to claim 10, wherein
the masking film has water-repellent and soil-resistant properties.

18. The metal pattern producing method according to claim 10, wherein
the substrate is made of a resin.

19. The metal pattern producing method according to claim 10, wherein
the metal pattern is a wiring pattern or a decoration-use pattern.

20. A metal pattern formed by:
forming a monomolecular film containing fluorinated alkyl chains (CF3(CF2)n—, where n represents an integer) on a surface of a metal film;
forming a masking film by applying a solution in which a molecule having a mercapto group (—SH) or a disulfide (—SS—) group is dissolved over a surface of the monomolecular film so that the molecule having a mercapto group (—SH) or a disulfide (—SS—) group penetrates in interstices between molecules composing the monomolecular film; and
etching the metal film by exposing the surface of the metal film to an etching solution so that a portion of the metal film in a region not covered with the masking film is removed.

* * * * *